United States Patent
Scheidt

(10) Patent No.: US 8,397,188 B1
(45) Date of Patent: Mar. 12, 2013

(54) SYSTEMS AND METHODS FOR TESTING A COMPONENT BY USING ENCAPSULATION

(75) Inventor: Paul Norbert Scheidt, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 46 days.

(21) Appl. No.: 12/886,835

(22) Filed: Sep. 21, 2010

(51) Int. Cl.
- *G06F 17/50* (2006.01)
- *G06F 9/455* (2006.01)
- *G01R 31/28* (2006.01)

(52) U.S. Cl. ............ 716/106; 703/16; 703/28; 714/724; 716/108

(58) Field of Classification Search ................. None
See application file for complete search history.

(56) References Cited

U.S. PATENT DOCUMENTS

| | | | | |
|---|---|---|---|---|
| 5,911,039 A * | 6/1999 | Hashizume et al. | ............ | 714/30 |
| 6,587,995 B1 * | 7/2003 | Duboc et al. | ............ | 716/106 |
| 6,678,875 B2 * | 1/2004 | Pajak et al. | ............ | 716/106 |
| 6,732,296 B1 * | 5/2004 | Cherny et al. | ............ | 714/32 |
| 6,966,044 B2 * | 11/2005 | Reuland et al. | ............ | 716/117 |
| 7,047,176 B2 * | 5/2006 | Klevans et al. | ............ | 703/21 |
| 7,299,155 B2 | 11/2007 | Ebert et al. | | |
| 7,340,700 B2 * | 3/2008 | Emerson et al. | ............ | 716/111 |
| 7,725,784 B2 * | 5/2010 | Laouamri et al. | ............ | 714/724 |
| 7,765,080 B2 * | 7/2010 | Ludwig et al. | ............ | 702/122 |
| 7,783,925 B2 * | 8/2010 | Swoboda | ............ | 714/30 |
| 7,890,901 B2 * | 2/2011 | Gemmeke et al. | ............ | 716/106 |
| 7,904,872 B2 * | 3/2011 | Ebbers et al. | ............ | 716/138 |
| 7,941,722 B2 * | 5/2011 | Cussonneau et al. | ............ | 714/742 |
| 2006/0101309 A1 * | 5/2006 | Mohiuddin et al. | ............ | 714/33 |
| 2006/0271904 A1 * | 11/2006 | Emerson et al. | ............ | 716/18 |
| 2007/0036082 A1 * | 2/2007 | Sonksen et al. | ............ | 370/242 |
| 2008/0034334 A1 * | 2/2008 | Laouamri et al. | ............ | 716/4 |
| 2008/0263486 A1 * | 10/2008 | Alexanian et al. | ............ | 716/5 |
| 2009/0083683 A1 | 3/2009 | Snell | | |
| 2010/0134133 A1 * | 6/2010 | Pagani | ............ | 324/763 |
| 2010/0201400 A1 * | 8/2010 | Nardone et al. | ............ | 326/101 |
| 2010/0251023 A1 * | 9/2010 | Swoboda | ............ | 714/30 |
| 2011/0029960 A1 * | 2/2011 | Cimadamore et al. | ............ | 717/141 |
| 2011/0035718 A1 * | 2/2011 | McBeth | ............ | 716/136 |

* cited by examiner

*Primary Examiner* — A. M. Thompson

(74) *Attorney, Agent, or Firm* — Weaver Austin Villeneuve & Sampson LLP

(57) ABSTRACT

Systems and methods for testing a component by using encapsulation are described. The systems and methods facilitate communication between two components that use two different languages in a test environment. Such communication is allowed by encapsulating an identifier of a function to create a call message, encapsulating an identifier of an event to create an event message, or encapsulating an identifier of the function to create a return message.

23 Claims, 18 Drawing Sheets

SYSTEMS AND METHODS FOR TESTING A COMPONENT BY USING ENCAPSULATION

FIELD OF THE INVENTION

The present disclosure relates to systems and methods for testing a component by using encapsulation.

BACKGROUND

In electronic design automation (EDA), functional verification is the task of verifying that a logic design conforms to its specification. Logic simulation is the process of simulating a logic design before the logic design manufactured as integrated circuits (ICs). In software simulation, a description of the logic design is simulated on computers or workstations. Logic designs may be described using various languages, such as hardware description languages (HDLs) or other more abstract languages (e.g., synthesizable SystemC). In software simulation, engineers write a test-bench program to functionally verify the logic design by providing meaningful scenarios to check that, given certain input stimuli, the design performs to specification. A test-bench may be written using various languages, including lower-level languages, such as very high speed integrated circuit HDL (VHDL), Verilog, and the like, as well as more abstract languages, such as C/C++, SystemC, SystemVerilog, and the like. Higher-level languages, such as SystemC, allow engineers to write more abstract test-bench models for simulation, such as transaction-level models (TLMs), as opposed to lower-level register transfer level (RTL) models.

The test bench includes various components that may be tested. However, in certain cases, it may be difficult for the components to communicate with each other.

SUMMARY OF THE INVENTION

Systems and methods for testing a component by using encapsulation are described. In various embodiments, the methods include connecting a test module component and a functional module component via a plurality of pins. The test module component is created by using a first programming language and the functional module component is created by using a second programming language that is different than the first programming language. In executing the methods, the test module component sends a function identifier of a function to be performed by the functional module component. The function identifier is encapsulated within a call wrapper. In an alternative embodiment, the first and second programming languages are the same.

The systems and methods allow communication between two components, such as the test and functional module components, that use two different languages in a test environment. Such communication is allowed by encapsulating the function identifier to create the call message.

In other embodiments, such communication is also allowed by encapsulating an identifier of an event to create an event message or by encapsulating an identifier of the function to create a return message. The encapsulation facilitates communication between the two components that use different or same languages.

BRIEF DESCRIPTION OF THE DRAWINGS

The systems and techniques may best be understood by reference to the following description taken in conjunction with the accompanying drawings, which illustrate specific embodiments of the present invention.

DETAILED DESCRIPTION

Figure 1:
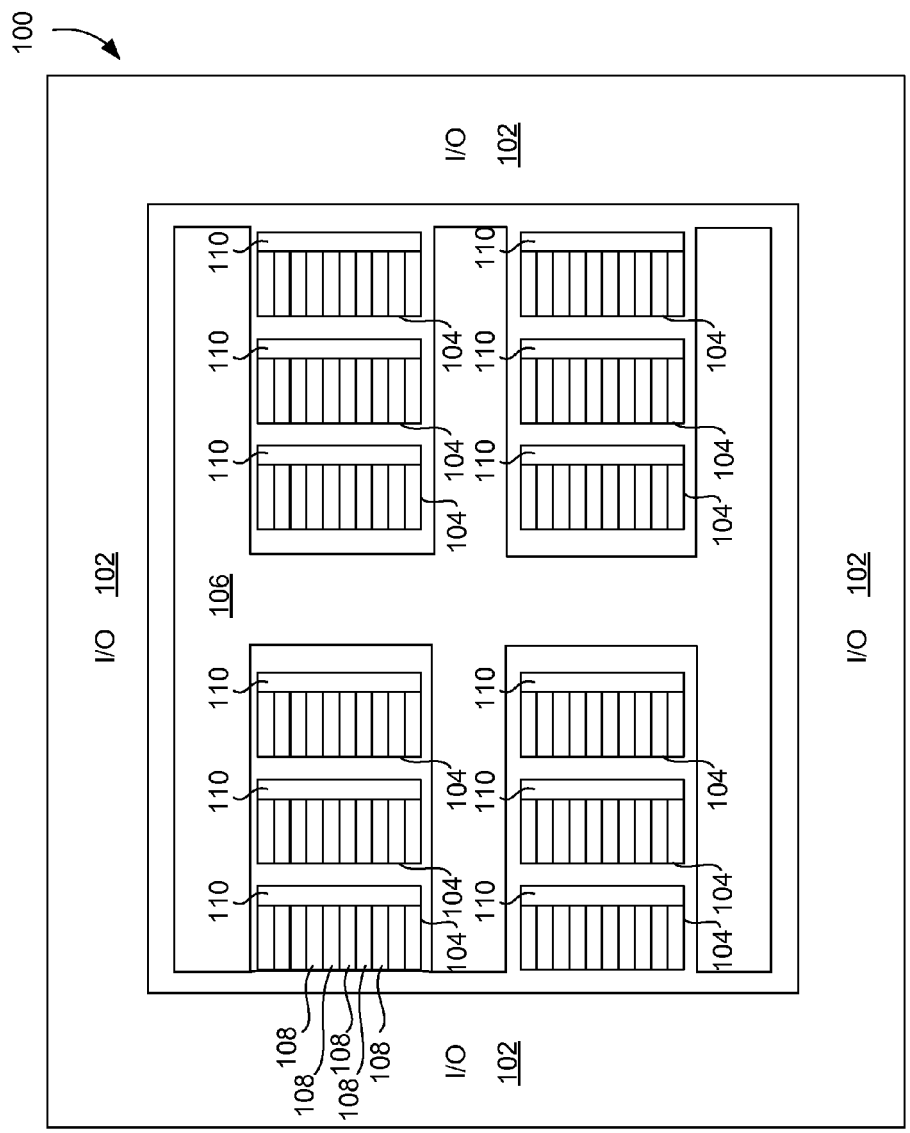
FIG. 1 is a block diagram of a programmable logic device (PLD) in an embodiment of the invention.

FIG. 1 is a block diagram of an embodiment of a programmable logic device (PLD) 100, such as a field programmable gate array (FPGA). PLD 100 includes a plurality of input/output (I/O) devices 102 and a plurality of logic array blocks (LABs) 104 connected to the I/O devices 102. One LAB 104 is connected to another LAB 104 via programmable routing and one or more LAB lines 106.

Each LAB 104 includes a plurality of logic elements (LEs) 108, which can be implemented as memory or logic. Each LE 108 can be flexibly configured to include one or more lookup tables (LUTs). LEs 108 are connected via a plurality of local lines 110.

Figure 2:
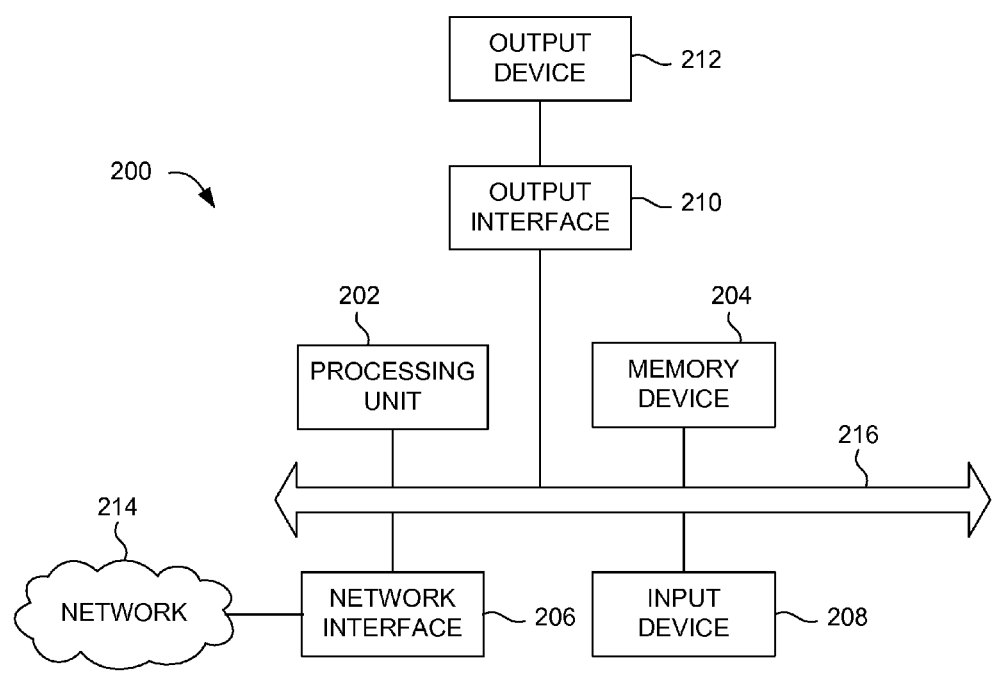
FIG. 2 is a block diagram of a system that is used to generate a design of the PLD in an embodiment of the invention.

FIG. 2 is a block diagram of a system 200 that is used to generate a design of PLD 100 (FIG. 1). System 200 includes a processing unit 202, a memory device 204, a network interface 206, an input device 208, an output interface 210, and an output device 212. System 200 is an exemplary computing device. For example, system 200 may be a computer, such as a personal computer, a desktop, or a laptop.

Processing unit 202 may be a central processing unit (CPU), the processor, a microprocessor, a hardware controller, a microcontroller, a programmable logic device programmed for use as a controller, a network controller, or other processing unit. Memory device 204 may be a random access memory (RAM), a read-only memory (ROM), or a combination of RAM and ROM. For example, memory device 204 includes a computer-readable medium, such as a floppy disk, a ZIP™ disk, a magnetic disk, a hard disk, a compact disc-ROM (CD-ROM), a recordable CD, a digital video disc (DVD), or a flash memory. Memory device 204 stores a System on Programmable Chip (SOPC) Builder, which may be a Quartus Systems (QSYS™) Editor, for designing PLD 100.

Network interface 206 may be a modem or a network interface card (NIC) that allows processing unit 202 to communicate with a network 214, such as a wide area network (WAN) or a local area network (LAN). Processing unit 202 may be connected via a wireless connection or a wired connection to network 214. Examples of the wireless connection include a connection using Wi-Fi protocol or a WiMax protocol. The Wi-Fi protocol may be an IEEE 802.11, IEEE 802.11a, IEEE 802.11b, IEEE 802.11g, or IEEE 802.11i protocol. Examples of input device 208 include a mouse, a keyboard, a stylus, or a keypad.

Output device 212 may be a liquid crystal display (LCD) device, a plasma display device, a light emitting diode (LED) display device, or a cathode ray tube (CRT) display device. Examples of output interface 210 include a video controller that drives output device 212 to display one or more images based on instructions received from processing unit 202, a light source, or an audio signal generator with speakers that outputs audible sound based on instructions received from processing unit 202. The light source may be a set of light emitting diodes (LEDs) or a cold cathode fluorescent lamp (CCFL). Processing unit 202 may access the techniques, described herein, for testing a component, from memory device 204 or from a remote memory device (not shown), similar to memory device 204, via network 214, and executes the techniques. Processing unit 202, memory device 204, network interface 206, input device 208, output interface 210, and output device 212 communicate with each other via a bus 216. In an alternative embodiment, system 200 may not include network interface 206.

Figure 3:
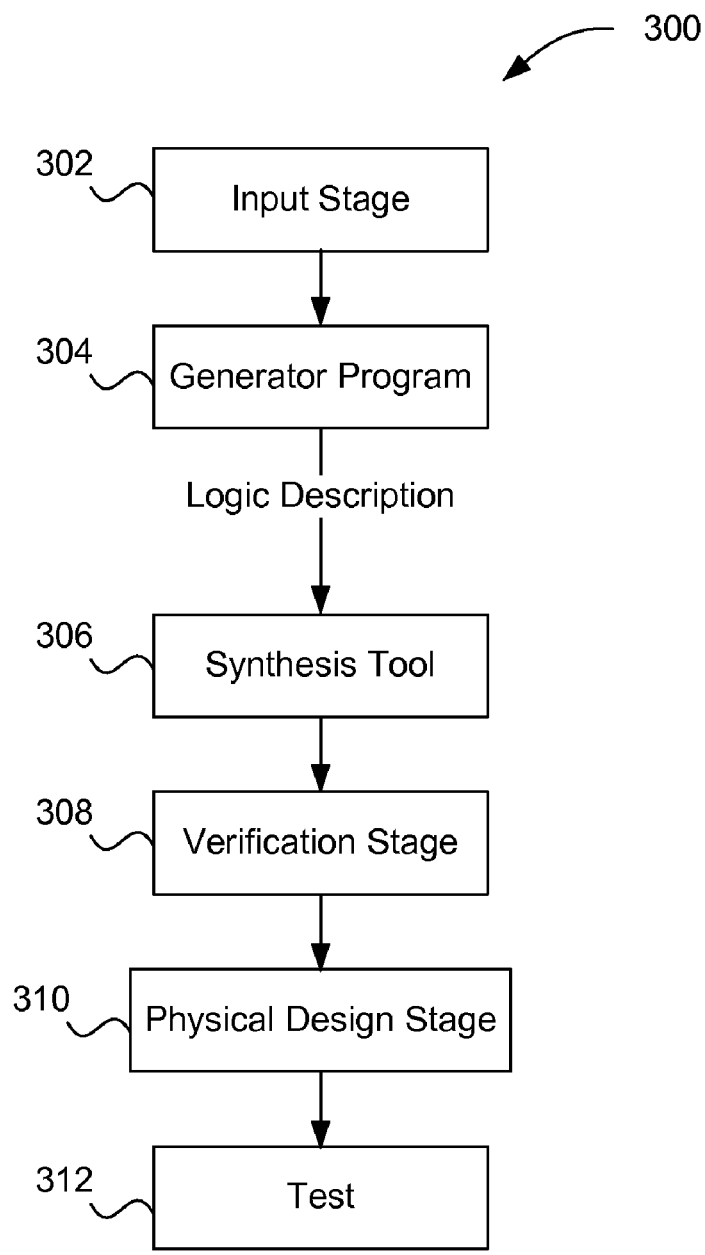
FIG. 3 is a diagrammatic representation showing a technique executed using the system of FIG. 2 to design the PLD.

FIG. 3 is a diagrammatic representation showing a technique 300 executed using system 200 (FIG. 2) to design PLD 100 (FIG. 1). An input stage 302 receives selection information typically from a user for logic, such as, a processor core as well as other components such as a streaming output device to be implemented on PLD 100 (FIG. 1). In one example, an input received is in the form of a high-level language program.

FIG. 3 is a diagrammatic representation showing a technique 300 executed using system 200 (FIG. 2) to design PLD 100 (FIG. 1). An input stage 302 receives selection information typically from a user for logic, such as, a processor core as well as other components such as a streaming output device to be implemented on PLD 100 (FIG. 1). In one example, an input received is in the form of a high-level language program.

In one example, input stage 302 often allows selection and parameterization of components to be used on PLD 100 (FIG. 1). Input stage 302 also allows configuration of variable or fixed latency support. In some examples, components provided to an input stage 302 include intellectual property functions, megafunctions, and intellectual property cores. Input stage 302 may be a graphical user interface (GUI) using wizards for allowing efficient or convenient entry of information. Input stage 302 may also be a text interface or a program reading a data file such as a spreadsheet, database table, or schematic to acquire selection information. Input stage 302 produces an output containing information about the various modules selected.

A generator program 304 creates a logic description from information received via input stage 302 and provides the logic description along with other customized logic to any of a synthesis tool 306, place and route programs, and logic configuration tools to allow a logic description to be implemented on PLD 100 (FIG. 1).

In typical implementations, generator program 304 can identify the selections and generate a logic description with information for implementing the various modules. Generator program 304 can be a Perl script creating Hardware Description Language (HDL) files, such as, Verilog, Abel, Very High Speed Integrated Circuit HDL (VHDL), and Altera™ HDL (AHDL) files, from the module information entered by the user.

Generator program 304 also provides information to synthesis tool 306 to allow HDL files to be automatically synthesized. In some examples, a logic description is provided directly by the user. Hookups between various components selected by the user are also interconnected by generator program 304. Some of the available synthesis tools are Leonardo Spectrum™, available from Mentor Graphics™ Corporation of Wilsonville, Oreg. and Synplify™ available from Synplicity™ Corporation of Sunnyvale, Calif. The HDL files may contain technology specific code readable by synthesis tool 306.

Input stage 302, generator program 304, and synthesis tool 306 can be separate programs. The interface between the separate programs can be a database file, a log, or simply messages transmitted between the programs. For example, instead of writing a file to storage, such as memory device 204 (FIG. 2), input stage 302 can send messages directly to generator program 304 to allow the generator program 304 to create a logic description. Similarly, generator program 304 can provide information directly to synthesis tool 306 instead of writing HDL files. Similarly, input stage 302, generator program 304, and synthesis tool 306 can be integrated into a single program.

The user may select various modules and an integrated program can then take the user selections and output a logic description in the form of a synthesized netlist without intermediate files. According to other embodiments, a logic description is a synthesized netlist such as an Electronic Design Interchange Format Input File (EDF file). An EDF file is one example of a synthesized netlist file that can be output by synthesis tool 306.

Synthesis tool 306 can take HDL files and output EDF files. Synthesis tool 1906 allows the implementation of the logic design on PLD 100 (FIG. 1).

A verification stage 308 typically follows an application of synthesis tool 306. Verification stage 308 checks the accuracy of the logic deign of PLD 100 (FIG. 1) to ensure that an intermediate or final design realizes the expected requirements. Verification stage 308 typically includes simulation tools, functional verification tools, and timing analysis tools for timing verification. A test module component, described below, may be a part of verification stage 308. For example, the test module component is part of a simulation tool generated during verification stage 308. Tools for simulation allow the application of inputs and the observation of outputs without having to implement PLD 100 (FIG. 1). Simulation tools provide the user with cost effective and efficient mechanisms for both functional and timing verification of a design of PLD 100 (FIG. 1). Functional verification involves the circuit's logical operation independent of timing considerations. During functional verification, gate delays are disregarded.

Timing verification involves the analysis of the design's operation with timing delays. Setup, hold, and other timing requirements for sequential devices, such as, flip-flops, within a design of PLD 100, are confirmed. Some available simulation tools include Synopsys VCS™, VSS, and Scirocco™, available from Synopsys™ Corporation of Sunnyvale, Calif. and Cadence NC-Verilog™ and NC-VHDL™ available from Cadence Design Systems™ of San Jose, Calif.

After verification stage 308, the synthesized netlist file can be provided to a physical design stage 310 including the place and route phase and configuration tools. The place and route phase typically locates logic cells on specific logic elements of PLD 100 (FIG. 1) and connects wires between the inputs and outputs of various logic elements of the PLD 100 in accordance with logic required to implement an electronic design. PLD 100 (FIG. 1) can also be physically tested at 312.

For programmable logic devices, a programmable logic configuration stage can take the output of the place and route phase to program PLD 100 (FIG. 1) with the user selected and parameterized modules. According to various embodiments, the place and route phase and the logic configuration stage are provided in a Quartus™ Development Tool, available from Altera™ Corporation.

As noted above, different stages and programs can be integrated in a variety of manners. According to one embodiment, input stage 302, generator program 304, synthesis tool 306, verification stage 308, and physical design stage 310 are integrated into a single program such as a System On a Programmable Chip (SOPC) Builder. The various stages are automatically run using system 200 (FIG. 2) and transparent to the user. Technique 300 can receive the user selected modules, generate a logic description depicting logic for implementing the various selected modules, and implement PLD 100 (FIG. 1). As will be appreciated by one of skill in the art, HDL files and EDF files are mere examples of a logic description. Other file formats as well as internal program representations are other examples of a logic description.

Figure 4:
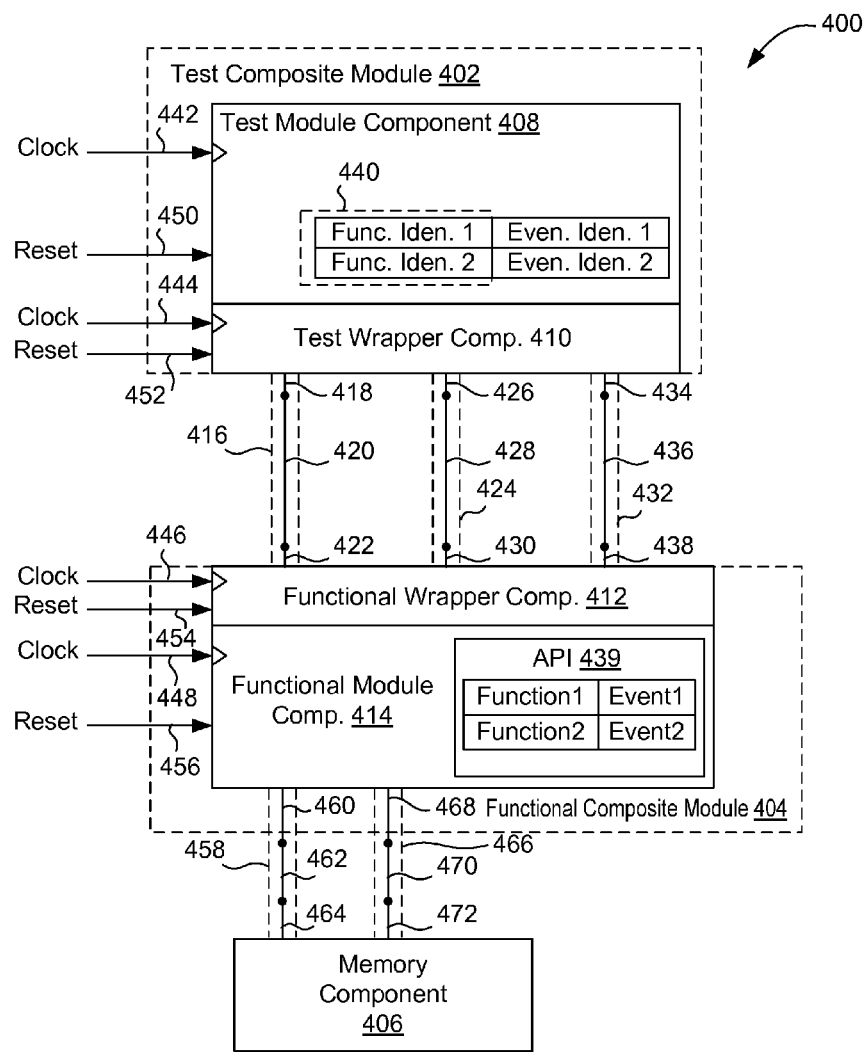
FIG. 4 is a block diagram of an embodiment of a system for testing a component by using encapsulation.

FIG. 4 is a block diagram of an embodiment of a system 400 for testing a component by using encapsulation. System 400 is a test bench that may be created by using the SOPC Builder or may be composed manually by writing HDL code. System 400 includes a test composite module 402, a functional composite module 404, and a memory component 406, which is an exemplary device under test (DUT). Test composite module 402 and functional composite module 404 may be located on the same chip having a single substrate. Moreover, memory component 406 and test composite module 402 and/or functional composite module 404 may be located on the same chip having a single substrate. Test composite module 402 includes a test module component 408 and a test wrapper component 410. Functional composite module 404 includes a functional wrapper component 412 and a functional module component 414. Test wrapper component 410 is connected to functional wrapper component 412 via a call connection 416 including a test wrapper call pin 418, a call channel 420, and a functional wrapper call pin 422. Test wrapper component 410 is also connected to functional wrapper component 412 via a return connection 424 including a test wrapper return pin 426, a return channel 428, and a functional wrapper return pin 430. Test wrapper component 410 is connected to functional wrapper component 412 via an event connection 432 including an event pin 434, an event channel 436, and a functional wrapper event pin 438.

Functional module component 414 may be a master component that sends commands to a slave component or may be a slave component that receives commands from a master component. As an example, functional module component 414 is a memory mapped (MM) master bus functional module (BFM), an MM slave BFM, a streaming (ST) source BFM, or an ST sink BFM. A BFM may use any bus specification, such as an advanced microcontroller bus architecture (AMBA) specification developed by ARM™ corporation, an Avalon™ specification developed by Altera™ corporation, or a MicroBlaze™ bus specification developed by Xilinx™ corporation, to send and receive commands. Functional module component 414 may be a memory controller, a bus controller, a processor, a switch fabric, or any other component. Memory component 406 may be a RAM or a ROM.

Test module component 408 is created as software by using a programming language different than a programming language used to create functional module component 414. For example, test module component 408 is created using VHDL, SystemC, or AHDL and functional module component 414 is created by using Verilog, SystemVerilog, or Abel. As another example, test module component 408 is created by using a first mixture of any two of VHDL, SystemC, and AHDL and functional module component 414 is created by using a second mixture of any two of Verilog, SystemVerilog, and Abel. As yet another example, test module component 408 is created by using Verilog, SystemVerilog, or Abel and functional module component 414 is created by using VHDL, SystemC, or AHDL. As another example, functional module component 414 is created by using the first mixture and test module component 408 is created by using the second mixture.

To use the SOPC Builder to create the test bench, all components of system 400 are described by hardware Tool Command language (Tcl) files, which may be stored in memory device 204 (FIG. 2). Each component of system 400 is represented by a hardware Tcl (hw.Tcl) file that describes the component to allow use of the component as an SOPC Builder component. For example, each of test wrapper component 410, test module component 408, functional module component 414, and functional wrapper component 412 has an associated Tcl file. A Tcl file can be created manually by the user via input device 208 or by using a Component Editor software.

System 400 is implemented as hardware, software, or a combination of software and hardware. For example, test module component 408 and functional module component 414 are integrated within the same integrated circuit, such as PLD 100 or an Application Specific Integrated Circuit (ASIC). As another example, test module component 408 and functional module component 414 are integrated within different integrated circuits. In this example, test module component 408 is integrated within a first PLD or ASIC and functional module component 414 is integrated within a second PLD or ASIC. As yet another example, each of test module component 408, test wrapper component 410, call connection 416, return connection 424, event connection 432, functional wrapper component 412, and functional module component 414 is a software component or a hardware component. As another example, each of test module component 408, test wrapper component 410, functional wrapper component 412, and functional module component 414 is implemented, in hardware, as LE 108 (FIG. 2) and pins 418, 422, 426, 430, 434, and 438 are hardware pins, and each channel 420, 428, and 436 is a conductor, such as a bus or a wire. As another example, each of test module component 408 and test wrapper component 410 is implemented, in hardware, as LE 108 (FIG. 2), each of functional wrapper component 412 and functional module component 414 is implemented as a software component that can be stored within memory device 204 (FIG. 2) and can be executed by processing unit 202 (FIG. 2), each pin 418, 422, 426, 430, 434, and 438 is a hardware pin, and each channel 420, 428, and 436 is a Joint Test Action Group (JTAG) connector. As yet another example, each of functional wrapper component 412 and functional module component 414 is implemented, in hardware, as LE 108 (FIG. 2), each of test module component 408 and test wrapper component 410 is implemented as a software component that can be stored within memory device 204 (FIG. 2) and can be executed by processing unit 202 (FIG. 2), each pin 418, 422, 426, 430, 434, and 438 is a hardware pin, and each channel 420, 428, and 436 is a Joint Test Action Group (JTAG) connector.

Each of test module component 408, test wrapper component 410, functional wrapper component 412, and functional module component 414 can be created by editing, by the user, HDL code generated by the SOPC Builder and adding the component to the code. If the user edits HDL code used to create the test bench, the modified test bench is retained on subsequent modifications and regeneration of the modified test bench.

Regardless of how a component of system 400 is created, there is no direct signaling between test module component 408 and functional module component 414. Rather, communication between test module component 408 and functional module component 414 occurs via a call message, a return message, or an event message, which are described below.

Functional module component 414 includes an Application Programming Interface 439 (API) that further includes a set of functions, including function 1 and function 2, executed by functional module component 414. An example of function 1 includes a write function and an example of function 2 includes a read function. A function is a transaction, such as a read or a write transaction. Test module component 408 controls functional module component 414, such as by issuing transactions or polling responses, via functions and/or events of API 439.

Test module component 408 includes a set 440 of function identifiers, including a function identifier 1 and a function identifier 2, and the number of function identifiers in test module component 408 are the same as the number of instances of functions in set 440. Function identifier 1 identifies an instance of function 1 and function identifier 2 identifies an instance of function 2. An example of function identifier 1 includes an identifier identifying an instance of a write function stored within functional module component 414 and an example of function identifier 2 includes an identifier identifying an instance of a read function stored within functional module component 414. API 439 also includes a set of event identifiers, such as an event identifier 1 and an event identifier 2. Event identifier 1 identifies an instance of an event 1 and event identifier 2 identifies an instance of an event 2. A set of events, including events 1 and 2, are stored in functional module component 414.

API 439 includes the set of events, including events 1 and 2. An event is similar to a function except that the event has only one phase equivalent to an API return unsolicited by test module component 408. A function has two phases including an API call, which is a solicitation by test module component 408 and an API return, which is a response to the solicitation. Examples of an instance of an event include a notification of an instance of an error in functional module component 414. Another example of an instance of an event includes a notification that a return value, described below, is received by a response queue, also described below, of functional module component 414. The user labels an event with a particular prefix, such as 'signal_' or 'phenomenon_', or a suffix, such as '_signal' or '_phenomenon' by using input device 208 (FIG. 2) at input stage 302 (FIG. 3) to make the event publicly known, especially to test module component 408. For example, event 1 is labeled as "signal_event 1" and event 2 is labeled as "signal_event 2". The label used for labeling an event is not used for labeling a function, such as function 1 or function 2. For example function 1 may be labeled as "foo_function 1" and function 2 may be labeled as "soo_function 2". An event is used by test module component 408 for synchronizing with functional module component 414 by using a statement, such as an '@' statement or a 'wait' statement, which is created by the user at input state 302 by using input device 208. The statement is executed by functional module component 414 to monitor an occurrence of a condition and to execute an instance of the event upon occurrence of the condition. An event is unidirectional in that the event is transferred from functional module component 414 to test module component 408 and is not transferred from test module component 408 to functional module component 414.

Figure 5:
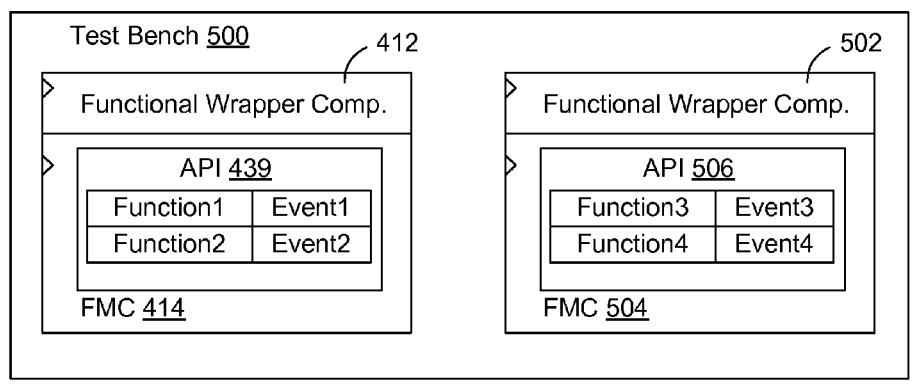
FIG. 5 is a block diagram of an embodiment of a test bench in which certain components of the system of FIG. 4 may be used.

An identifier, as used herein, is a associated with a location, such as a hierarchical instance path, of an instance of an event or an instance of a function within a test bench hierarchy. For example, as shown in FIG. 5, a hierarchy of a test bench 500 includes functional wrapper component 412, functional module component 414, another functional wrapper component 502, and another functional module component 504. The other functional module component 504 includes an API 506 that further includes a function 3, a function 4, an event 3, and an event 4. Location of instance 1 of function 1 within the hierarchy of test bench 500 may be "test bench 500.functional wrapper component 412.functional module component 414.API 439.function 1.instance 1". If function 1 is within a first set of functions and function 2 is within a second set of functions, location of instance 1 of function 1 may be "test bench 500. Functional wrapper component 412.functional module component 414.API 439.the first set of functions.function 1.instance 1" and location of instance 2 of function 2 within the hierarchy of test bench 500 may be "test bench 500. functional wrapper component 412.functional module component 414.API 439.the second set of functions.function 2.instance 2". As another example, location of instance 3 of function 3 is "test bench 500. functional wrapper component 502. functional module component 504.API 506.function 3.instance 3". As yet another example, location of instance 4 of function 4 is "test bench 500. functional wrapper component 502.API 506.function 4.instance 4".

Test module component 408 can reach across hierarchical boundaries and access any event of function of API 439 or API 506 if a hierarchical instance path of the event or functions is stored within test module component 408. For example, if a function identifier 3 identifying an instance 3 of function 3 is associated, such as linked, with a hierarchical instance path "test bench 500.functional wrapper component 502.API 506.function 3.instance 3", test module component 408 module can access the instance 3 of function 3 by calling the function identifier 3 that is equivalent to calling the hierarchical instance path.

A call is a hierarchical cross-module reference between test module component 408 and functional module component 414, and such reference is specific to hierarchy of a component in test bench 500. For example, test module component 408 has a particular hierarchy within test bench 500. As another example, test module component 408 is executed first in order to test memory component 406. As yet another example, test module component 408 may be a macro named 'MSTR' that points to functional module component 414 that is controlled by an API call made by test module component 408. If there is a change in test bench 500, such as renaming of an instance of component of test bench 500, or a change in hierarchy of the component within the test bench 500, the API call is also changed to reflect the change in the test bench 500 or in the hierarchy.

In an alternative embodiment, functional module component 504 includes any number of functions and events. In yet another embodiment, any or all of functions 3 and 4 are located in functional module component 414 instead of functional module component 504 and any or all of events 3 and 4 are located in functional module component 414 instead of functional module component 504. In yet another alternative embodiment, test module component 408 is created as software by using the same programming language as that used to create functional module component 414. In still another alternative embodiment, a BFM uses an Ethernet specification.

In another alternative embodiment, test composite module 402 is located on a chip having a single substrate that is separate from a chip having another single substrate on which functional composite module 404 is located. Moreover, in another alternative embodiment, memory component 406 is located on a chip having a single substrate separate from a chip having another single substrate on which test composite module 402 or functional composite module 404 is located. In various alternative embodiments, test composite module 402 is located on a different chip than a chip on which memory component 406 is located and the memory component 406 is located on the chip different than a chip on which functional composite module 404 is located. A chip having a single substrate is different than another chip having a single substrate.

In yet another alternative embodiment. system 400 is created using a custom programming software, such as an HDL language or SystemC language.

It is also noted that each function 1, 2, 3, and 4 can have one or multiple instances. For example, function 1 is executed in instances 1 and 1₁. In this example, the same function 1 is executed two times in multiple instances 1 and 1₁. As another example, each event 1, 2, 3, and 4 can have one or multiple instances. In this example, the same event 3 is executed three times in multiple instances 3, 3₁, and 3₂, where instance 3 is the first instance of event 3, instance 3₁ is the second instance of event 3, and instance 3₂ is the third instance of event 3.

Referring back to FIG. 4, each of test module component 408, test wrapper component 410, functional wrapper component 412, and functional module component 414 operate synchronous to a particular clock signal. For example, test module component 408 operates synchronous to a clock signal 442, test wrapper component 410 operates synchronous to a clock signal 444, functional wrapper component 412 operates synchronous to a clock signal 446, and functional module component 414 operates synchronous to a clock signal 448. Each clock signal 442, 444, 446, and 448 is generated by a clock source (not shown). For example, clock signal 442 is generated by a signal oscillator (not shown), clock signal 444 is generated by another signal oscillator (not shown), clock signal 446 is generated by yet another signal oscillator (not shown), and clock signal 448 is generated by still another signal oscillator (not shown). The clock signals 442, 444, 446, and 448 may be synchronous with each other or one or more of the clock signals is asynchronous with the remaining of the clock signals. In various embodiments in which one or more of the clock signals 442, 444, 446, and 448 is asynchronous with the remaining of the clock signals, one or more clock domains of the one or more of the clock signals is synchronized with the remaining of clock domains of the remaining of the clock signals by a technique, such as clock domain crossing.

Also, test module component 408 may be reset by a reset signal 450, test wrapper component 410 may be reset by another reset signal 452, functional wrapper component 412 is reset by yet another reset signal 454, and functional module component 414 is reset by still another reset signal 456. Reset signals 450, 452, 454, and 456 are asserted at time of initiation of simulation to test a component of a test bench, such as test bench 500.

In various embodiments, a first clock domain, of clock signal 446, with which a return message is synchronous is different than a second clock domain, of clock signal 444, with which a call message is synchronous. In an alternative embodiment, a third clock domain, of clock signal 446, with which an event message is synchronous is different than the first and/or second clock domains. Each clock domain has a unique frequency. For example, a frequency of the first clock domain is different than a frequency of the second clock domain and a frequency of the third clock domain.

In another alternative embodiment, clock signal 442 is the same as one or more of clock signals 444, 446, and 448, and reset signal 450 is the same as one or more of reset signals 452, 454, and 456.

In an alternative embodiment, event connection 432 is the same as return connection 424. In various embodiments, system 400 does not include memory component 406. In various alternative embodiments, test wrapper component 410 is a part of test module component 408 and functional wrapper component 412 is a part of functional module component 414. In various embodiments, API 439 includes any number of instances of events and the same number of event identifiers are stored within test module component 408. In other embodiments, API 439 includes any number of instances of functions and the same number of function identifiers are stored within test module component 408.

In another alternative embodiment, each of test module component 408, test wrapper component 410, functional wrapper component 412, and functional module component 414 can be created as a separate component within the SOPC Builder and all the components can be instantiated in parallel, and can be reused in other test benches.

In yet another alternative embodiment, memory component 406 may be replaced with any other DUT that is connected via a plurality of pins and ports to functional module component 414.

It is further noted that in another embodiment, any number of functional module components are connected to test wrapper component 410 in a similar manner in which functional module component 414 is connected to test wrapper component 410 and each functional module component is connected to a DUT.

In various embodiments, functional module component 414 is not a server connected via a network, such as the Internet or the Intranet, to a client.

Figure 6:
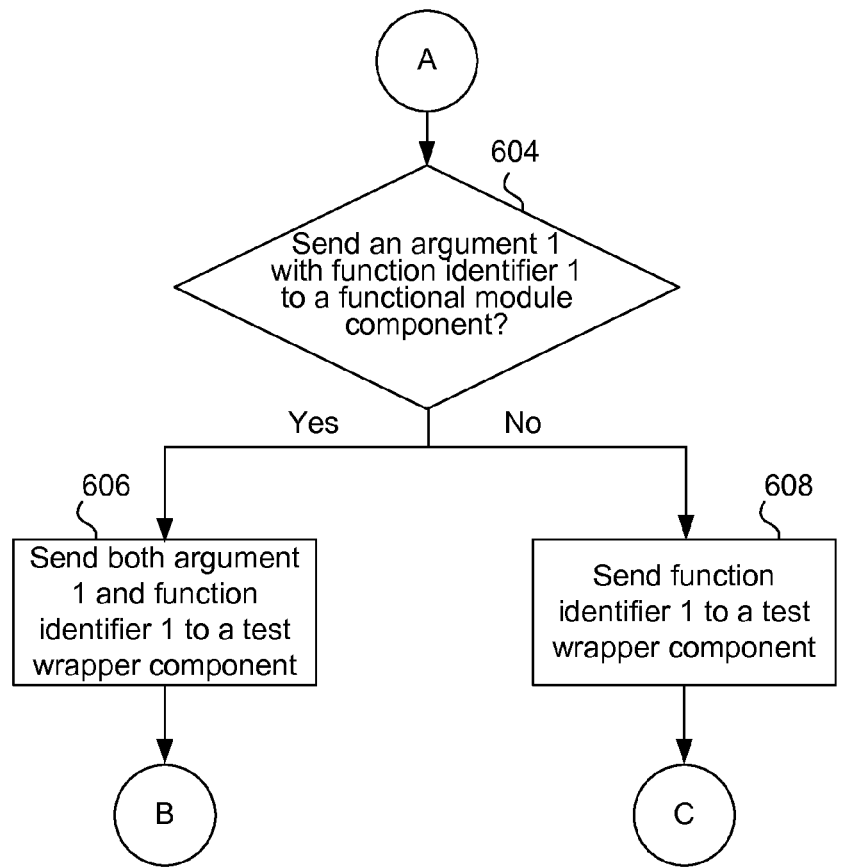
FIG. 6 is an embodiment of a method for testing a component by using encapsulation.
Figure 7:
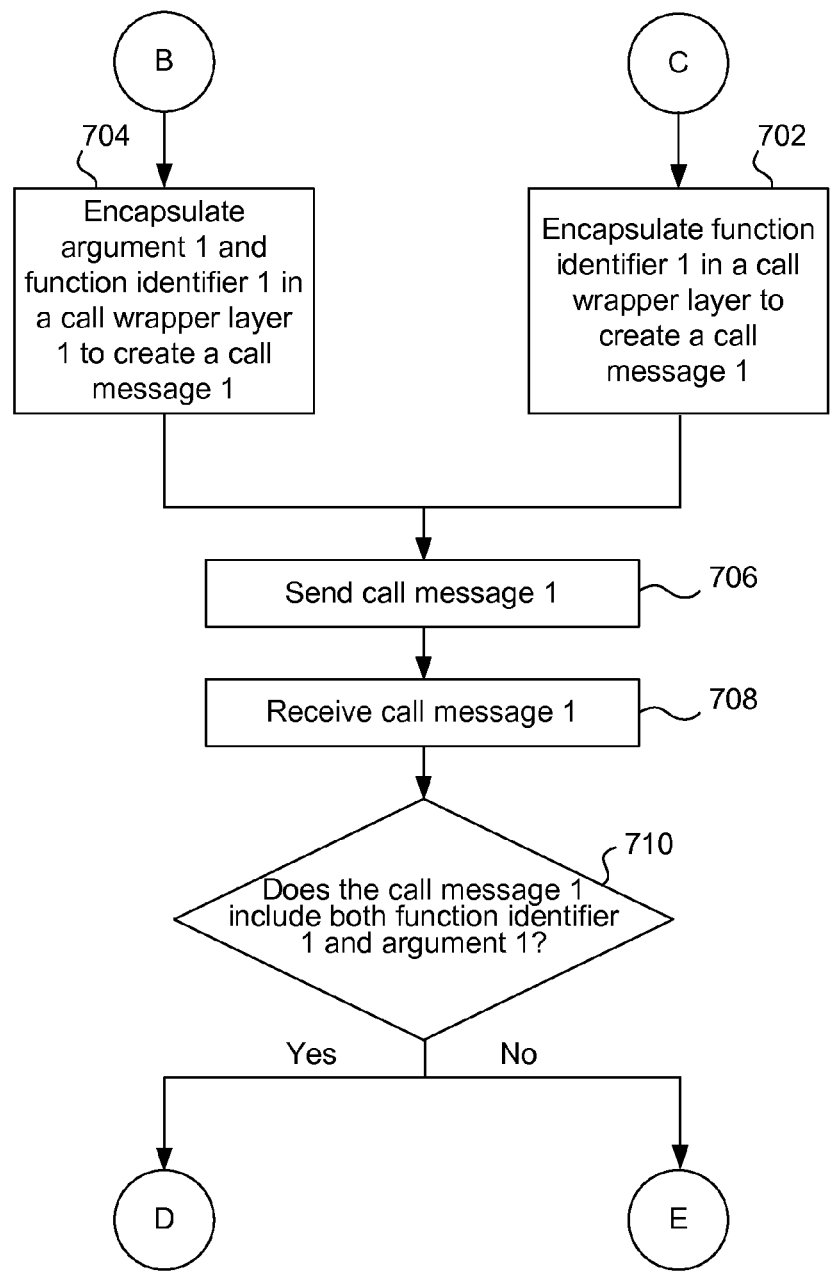
FIG. 7 is a continuation of the flowchart of FIG. 6.
Figure 8:
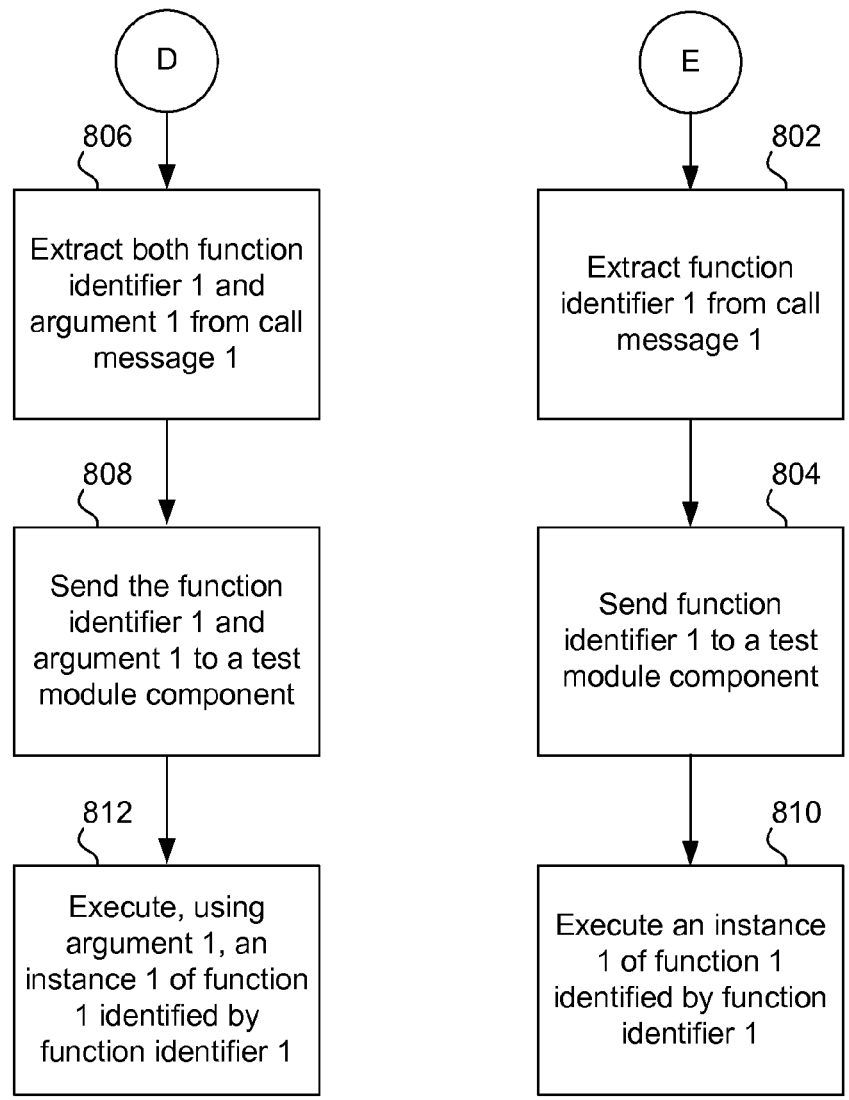
FIG. 8 is a continuation of the flowchart of FIG. 7.

FIGS. 6-8 are flowcharts of an embodiment of a method for testing a component by using encapsulation. Test module component 408 makes calls to API 439 to drive or monitor transactions. Test module component 408 determines 604 whether to send an argument 1 with function identifier 1 to functional module component 414. Argument 1 may be data to be written to memory component 406 or to functional module component 414. In making the determination 604, test module component 408 determines whether an instance 1, of function 1, identified by function identifier 1 will use argument 1. For example, if function 1 is a write function, function 1 will use argument 1 to write argument 1 to memory component 406. As another example, if function 1 is a read function, function 1 will not use argument 1. Upon determining that argument 1 will be used in executing function 1, test module component 408 determines to send argument 1 with function identifier 1 to test wrapper component 410. On the other hand, upon determining that argument 1 will not be used in executing function 1, test module component 408 determines not to send argument 1 with function identifier 1 to test wrapper component 410.

Upon determining to send argument 1 with function identifier 1, test module component 408 sends 606 both argument 1 and function identifier 1 to test wrapper component 410. On the other hand, upon determining not to send argument 1 with function identifier 1, test module component 408 sends 608 function identifier 1 to test wrapper component 410.

Upon receiving function identifier 1 and not receiving argument 1, test wrapper encapsulates 702 function identifier 1 in a call wrapper layer to create a call message 1. For example, function identifier 1 is attached, as a prefix or suffix, to call wrapper layer 1 to create call message 1. The function identifier 1 may be a numerical identifier, an alphanumeric identifier, or an identifier that only includes letters. An example of function identifier 1 includes a name assigned to function 1 by functional module component 414.

On the other hand, upon receiving both the function identifier 1 and argument 1, test wrapper component 410 encapsulates 704 both argument 1 and function identifier 1 within call wrapper layer 1 to create call message 1. For example, test wrapper component 410 attaches argument 1 as a prefix or a suffix to function identifier 1 to encapsulate both argument 1 and function identifier 1 within call wrapper layer 1 to create call message 1.

Test wrapper component 410 sends 706 call message 1 via call connection 416 to functional wrapper component 412. Functional wrapper component 412 receives 708 call message 1 from test wrapper component 410 and determines 710 whether the call message 1 includes both function identifier 1 and argument 1. Upon determining that call message 1 includes function identifier 1 and does not include argument 1, functional wrapper component 412 extracts 802 function identifier 1 from call message 1, and sends 804 functional identifier 1 to functional module component 414. If call message 1 includes both function identifier 1 and argument 1, functional wrapper component 412 extracts 806 both argument 1 and function identifier 1 from call message 1 and sends 808 the argument 1 and function identifier 1 to functional module component 414.

Upon receiving function identifier 1 from functional wrapper component 412, functional module component 414 executes 810 instance 1 of function 1, identified by function identifier 1. On the other hand, upon receiving both argument 1 and function identifier 1 from functional wrapper component 412, functional module component 414 executes 812 instance 1 of function 1 by using argument 1. For example, if function identifier 1 identifies instance 1 of function 1 of writing argument 1 to a memory location of memory component 406, functional module component 414 executes instance 1 of function 1 of sending argument 1 via a write connection 458 including a functional module component write pin 460, a write channel 462, and a memory component write pin 464 to write argument 1 to a memory location of memory component 406. Write connection 458 may be an on-chip bus, such as, a bus that applies the AMBA™ specification, the Avalon specification, or the MicroBlaze™ bus specification.

Functional module component 414 may receive another function identifier $1_1$ in a call message $1_1$ from test wrapper component 410 in a similar manner in which call message 1 is received, and executes an instance $1_1$ of function 1 upon receiving the function identifier $1_1$ that identifies instance $1_1$ of function 1. Instance 1 of function 1 is a first instance of function 1 and instance $1_1$ of function 1 is a second instance of function 1. Each instance of a function is an occurrence of the function and is identified by a unique function identifier.

In another embodiment, test module component 408 sends more than one argument, such as a list of arguments, via call message 1, to test wrapper component 410 that encapsulates the list within call wrapper 1.

Figure 9:
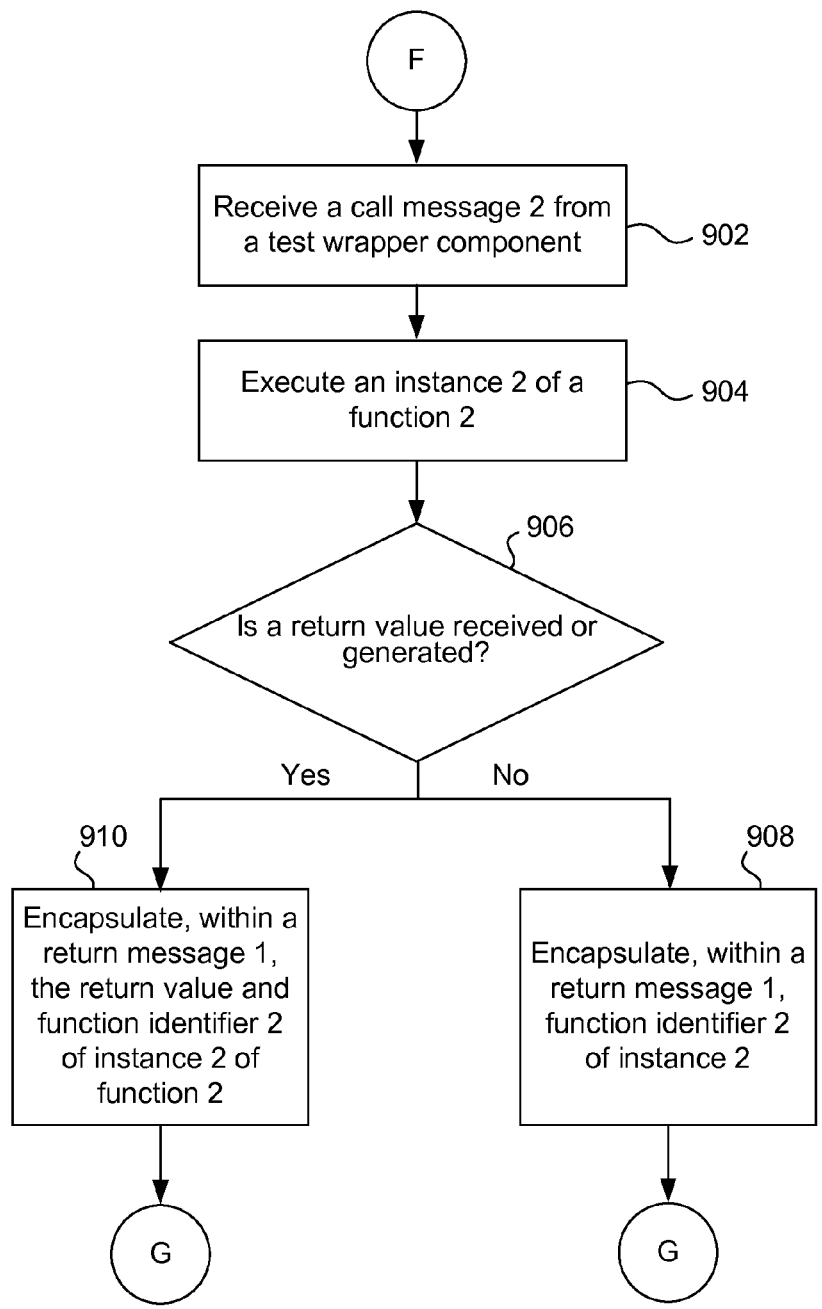
FIG. 9 is another embodiment of a method for testing a component by using encapsulation.
Figure 10:
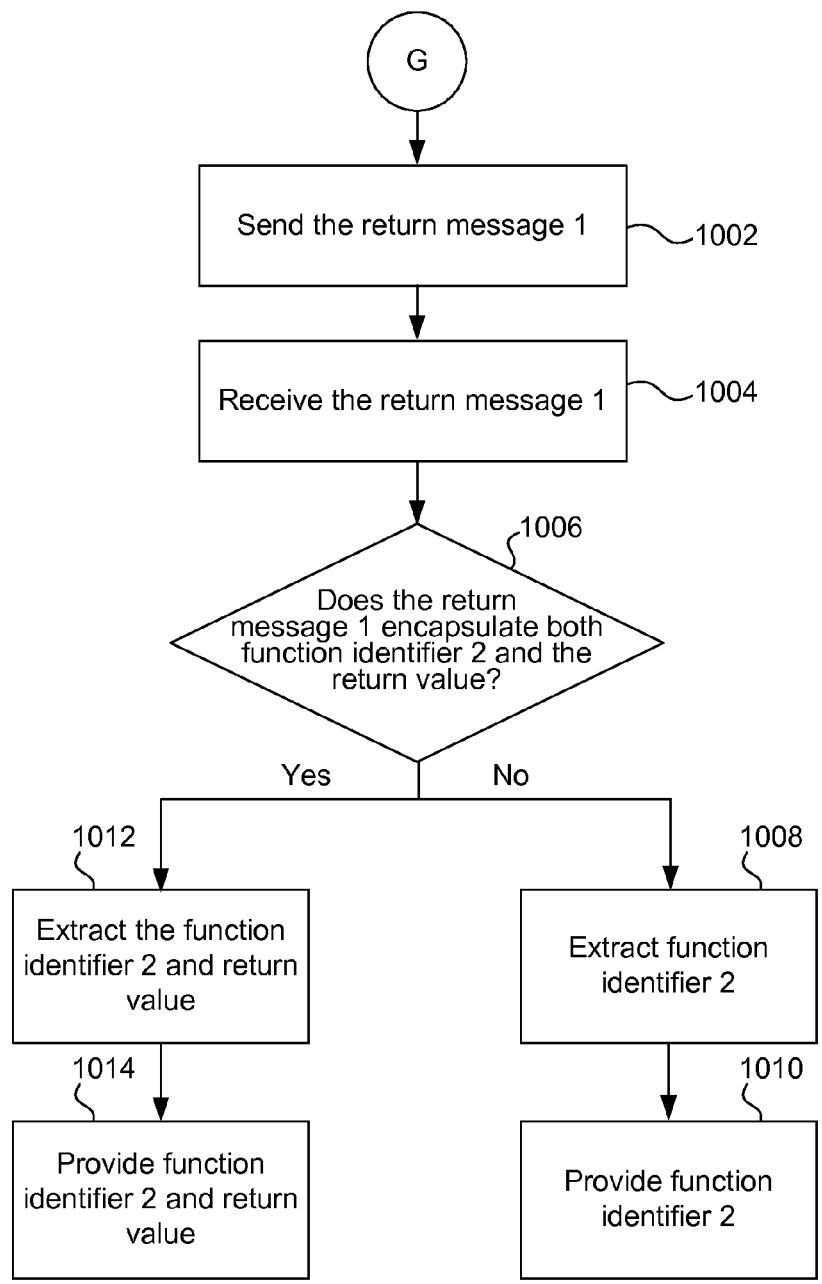
FIG. 10 is a continuation of the flowchart of FIG. 9.

FIGS. 9 and 10 are a flowchart of another embodiment of a method for testing a component. Functional wrapper component 412 receives 902 a call message 2, encapsulating function identifier 2, from test wrapper component 410 and functional module component 414 executes the instance 2 of function 2 identified by the function identifier 2 to receive the return value from memory component 406 via a read connection 466. The read connection 466 includes a functional module component read pin 468, a read channel 470, and a memory component read pin 472. For example, functional module component 414 executes 904 instance 2 of function 2 to read data from a memory location of memory component 406 or to generate the return value. It is noted that instance 2 is the first instance of execution of function 2. This memory location from which the return value is read may be the same as the memory location to which argument 1 is written. The return value may or may not be generated by the execution 904 of instance 2 of function 2. Read connection 466 may be an on-chip bus, such as, a bus that applies the AMBA™ specification, the Avalon specification, or the MicroBlaze™ bus specification.

Functional module component 414 determines 906 whether the return value is received from memory component 406 or is generated within functional module component 414. If the return value is received from memory component 406 or generated within functional module component 414, functional module component 414 sends the return value along with function identifier 2 identifying instance 2 of function 2 executed 904 to functional wrapper component 412. Instance 2 of function 2 is called by test module component 408 by sending the call message 2 to functional wrapper component 412. If the return value is not received from memory component 406 and is not generated within functional module component 414, functional module component 414 sends the function identifier 2 without sending the return value to functional wrapper component 412.

In case in which the function identifier 2 is received and the return value is not received by functional wrapper component 412 from functional module component 414, functional wrapper component 412 encapsulates 908, in a return wrapper layer 2, the function identifier 2 identifying instance 2 of function 2 that was called by call message 2 to generate a return message 1. In case in which the function identifier 2 and the return value are received by functional wrapper component 412 from functional module component 414, functional wrapper component 412 encapsulates 910, in the return wrapper layer 2, the function identifier 2 and the return value to generate the return message 1. Functional wrapper component 412 sends 1002 the return message 1 to test wrapper component 410 via return connection 424.

Test wrapper component 410 receives 1004 return message 1 from function wrapper component and determines 1006 whether the return message 1 encapsulates both the return value and function identifier 2. Upon determining that the return message 1 encapsulates the function identifier 2 and does not encapsulate the return value, test wrapper component 410 extracts 1008, from return message 1, the function identifier 2 of function 2 called via call message 2, and provides 1010 the function identifier 2 to test module component 408. On the other hand, upon determining that the return message 1 encapsulates both the function identifier 2 and the return value, test wrapper component 410 extracts 1012 both function identifier 2 and the return value from the return message 2 and provides 1014 both function identifier 2 and the return value to test module component 408.

Upon receiving function identifier 2 and not receiving the return value from test wrapper component 410, test module component 408 determines that instance 2, of function 2, called by using call message 2, was executed by functional module component 414. Upon receiving the return value and function identifier 2 from test wrapper component 410, test module component 408 stores the return value in addition to making the determination that instance 2, of function 2, called by using call message 2, was executed by functional module component 414.

Any of a call message, a return message, and an event message is transferred serially or in parallel over a corresponding connection. For example, call message 1 is transferred in parallel over call connection 416 in a single clock cycle of clock signal 444 (FIG. 4) or is transferred serially in a fixed width, such as N bits, over call connection 416, where N is an integer greater than zero. As another example, return message 1 is transferred in parallel over return connection 424 in a single clock cycle of clock signal 446 (FIG. 4) or is transferred serially in a fixed width, such as M bits, over return connection 424, where M is an integer greater than zero. As yet another example, event message 1 is transferred in parallel over event connection 432 in a single clock cycle of clock signal 446 or is transferred serially in a fixed width, such as P bits, over event connection 432, where P is an integer greater than zero. M may be the same or different than N and/or P. A fixed width is provided by the user via input device 208 (FIG. 2).

The number of clock cycles taken in communicating call, return, and/or event messages depends on parameterization between test wrapper component 410 and functional wrapper component 412 and the parameterization is provided by the user via input device 208 (FIG. 2). A width of a connection depends on parameterization of the connection and the parameterization is provided by the user via input device 208 (FIG. 2).

It is noted that each of call connection 416, return connection 424, event connection 432, read connection 466, and write connection 458 may communicate using an on-chip communication, such as the Avalon™ protocol, the AMBA™ protocol, or the MicroBlaze™ protocol. In an alternative embodiment, each of call connection 416, return connection 424, event connection 432, read connection 466, and write connection 458 may communicate using an off-chip connection, such as an Ethernet connection, a Peripheral Component Interconnect Express (PCI-e) connection, a Universal Serial Bus (USB) connection, a JTAG connection, a Hypertransport™ connection developed by Advanced MicroDevices (AMD™) corporation, or a QuickPath Interconnect (QPI™) developed by Intel™ corporation.

In an alternative embodiment, read connection 466 and write connection 458 are the same. In another alternative embodiment, argument 1 and the return value are communicated between functional module component 414 and memory component 406 via the same connection. In another alternative embodiment, the return value is not read from memory component 406 but is rather stored in functional module component 414.

In various embodiments, test module component 408 compares the return value with argument 1 to determine whether a match between the return value and argument has occurred. If there is a match, test module component 408 determines that functional module component 414 is operational and may indicate so to output device 212 (FIG. 2) that may display the determination or output the determination as an audio signal. On the other hand, if there is no match between the return value and argument 1, test module component 408 determines that functional module component 414 is nonoperational or malfunctioning, and may indicate the determination to output device 212 (FIG. 2) that may display the determination or output the determination as an audio signal.

In other embodiments, test module component 408 compares function identifier 1 with another function identifier received within a return message to determine whether the two function identifiers match. The other function identifier identifies function 1 of API 439 after execution of instance 1 of function 1. Function identifier 1 identifies function 1 of API 439 before execution of instance 1 of function 1. If there is a match, test module component 408 determines that instance 1 of function 1 was executed. On the other hand, if the match does not occur, test module component 408 determines that instance 1 of function 1 was not executed.

Figure 11:
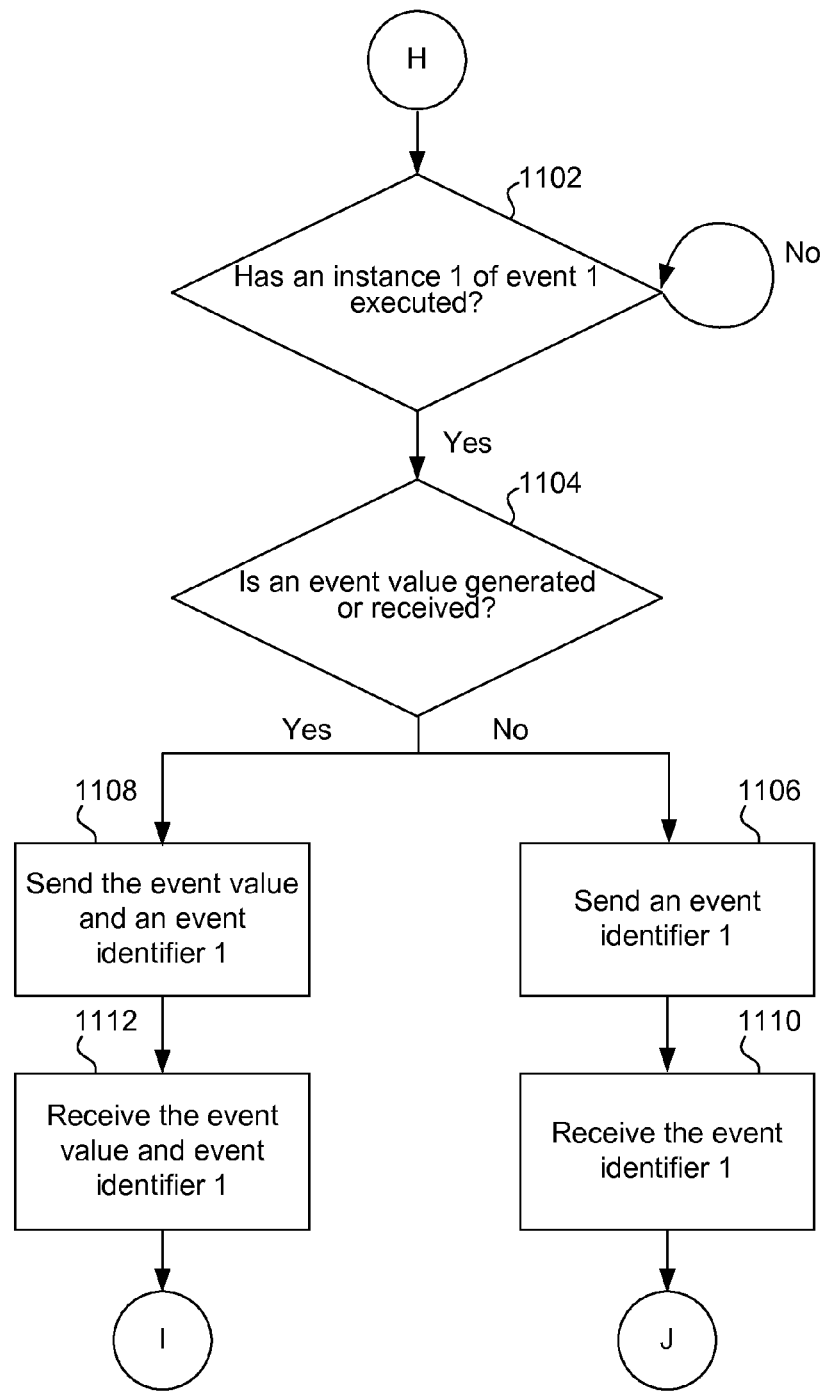
FIG. 11 is an embodiment of a method for testing a component by using encapsulation.
Figure 12:
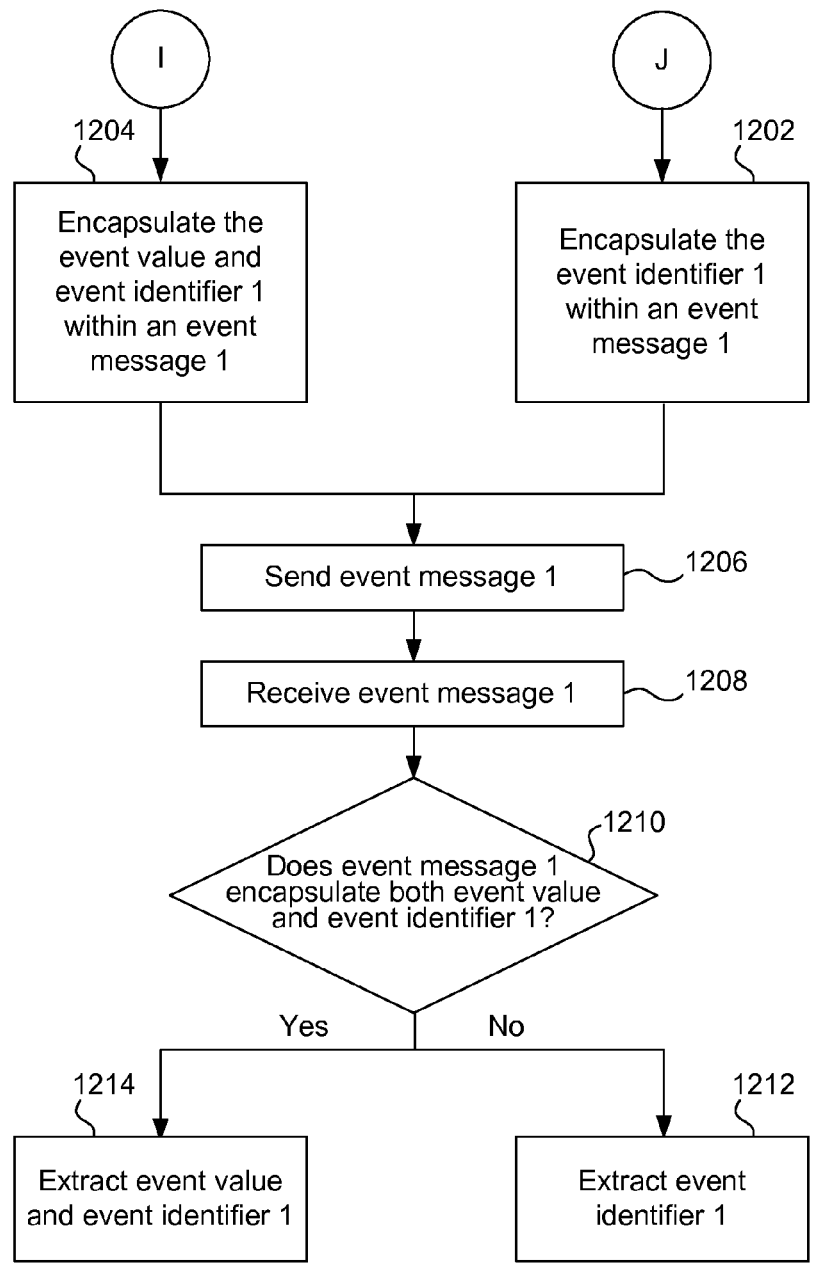
FIG. 12 is a continuation of the flowchart of FIG. 11.

FIGS. 11 and 12 are flowcharts of yet another embodiment of a method for testing a component. Functional module component 414 determines 1102 whether instance 1 of event 1 is executed. Functional module component 414 continues to determine 1102 whether an instance 1 of event 1 has occurred until instance 1 is completely executed. Upon execution of instance 1 of event 1, functional module component 414 determines 1104 whether an event value is generated within functional module component 414 or is received from memory component 406. Upon determining 1104 that the event value is not generated and is not received from memory component 406, functional module component 414 sends 1106 an event identifier 1 to functional wrapper component 412. An event identifier may be a numerical value, an alphanumeric value, or a value including only letters. If execution of instance 1 of event 1 by functional module component 414 generates an event value, such as data or an error bit, within functional module component 414 or if the execution of instance 1 of event 1 results in a reception of the event value from memory component 406, functional module component 414 sends 1108 the event value and event identifier 1 to functional wrapper component 412.

It is noted that an instance of an event is not triggered based on information in a call message received from test wrapper component 410. Rather, the condition that triggers execution of an instance of an event and the event are pre-defined by the user by using input device 208 (FIG. 2). For example, the user programs functional module component 414 to define the condition and an event that is triggered based on the condition. In various embodiments, an event performs the same task as that performed by a function of API 439 except that the event is not instantiated upon receiving a function identifier from test module component 408 but is rather triggered to perform the task upon occurrence of the condition.

Upon receiving 1110 the event identifier 1 without receiving the event value from functional module component 414, functional wrapper component 412 encapsulates 1202 event identifier 1 within an event wrapper layer 1 to generate an event message 1. On the other hand, if both event identifier 1 and the event value are received 1112 by functional wrapper component 412 from functional module component 414, functional wrapper component 412 encapsulates 1204 both the event identifier 1 and event value within the event wrapper layer 1 to generate the event message 1.

Functional wrapper component 412 sends 1206 the event message 1 to test wrapper component 410 via event connection 432. Upon receiving 1208 event message 1, test wrapper component 410 determines 1210 whether event message 1 encapsulates both the event value and event identifier 1.

Upon determining that event message 1 encapsulates event identifier 1 and not the event value, test wrapper component 410 extracts 1212 event identifier 1 from event message and determines that instance 1, of event 1, has occurred in functional wrapper component 412 and may send the determination to output device 212 (FIG. 2) to display the determination.

Upon determining that event message 1 encapsulates both event identifier 1 and the event value, test wrapper component 410 extracts 1214 event identifier 1 and the event value from event message 1, determines that the instance 1 of event 1 has occurred, and may store the event value 1.

In an alternative embodiment, an event identifier is encapsulated by a functional wrapper component (not shown) separate from functional wrapper component 412.

Figure 13:
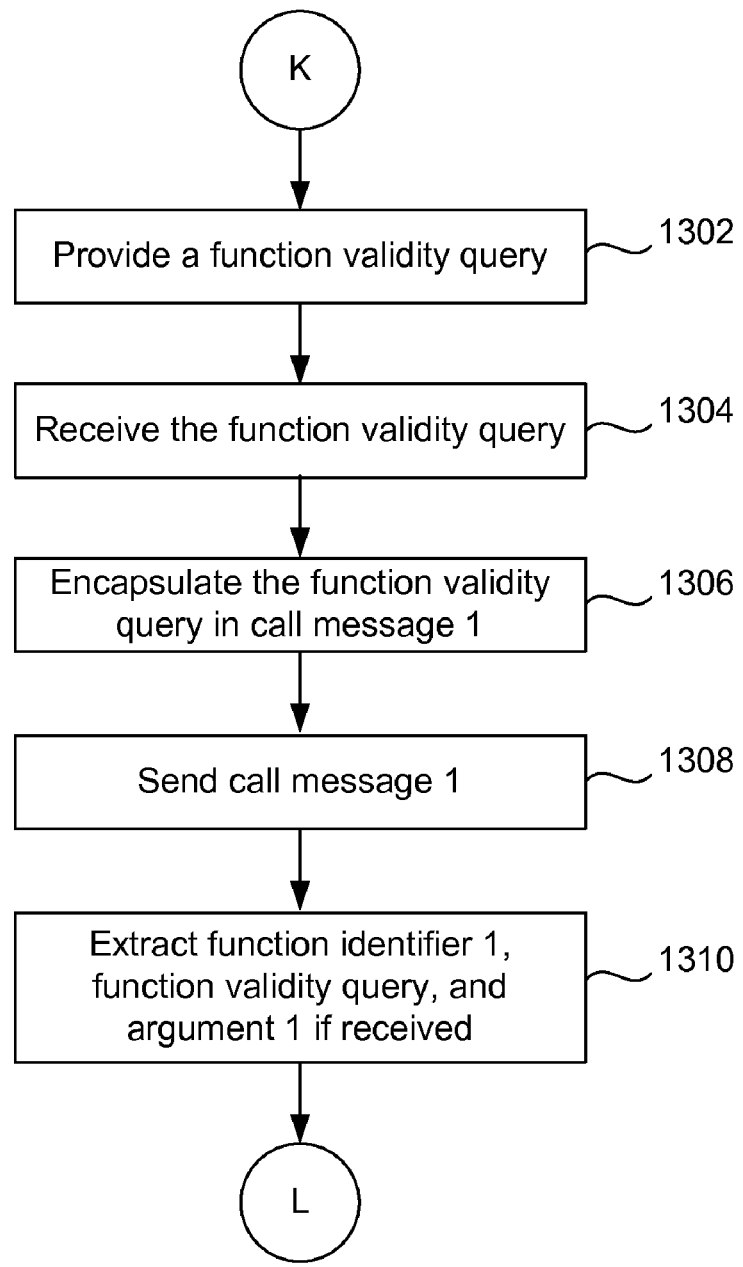
FIG. 13 is an embodiment of a method for testing a component by using encapsulation.
Figure 14:
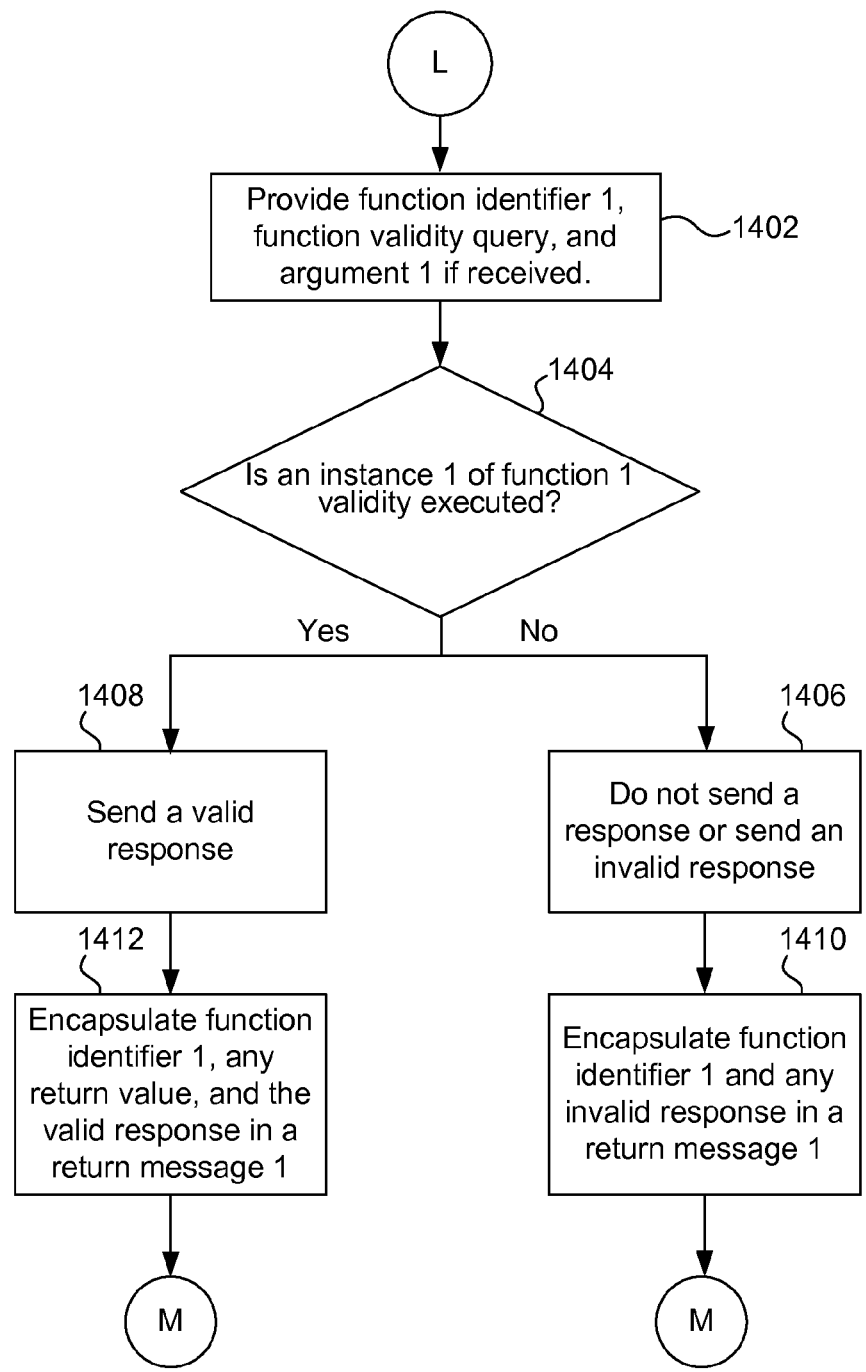
FIG. 14 is a continuation of the flowchart of FIG. 13.
Figure 15:
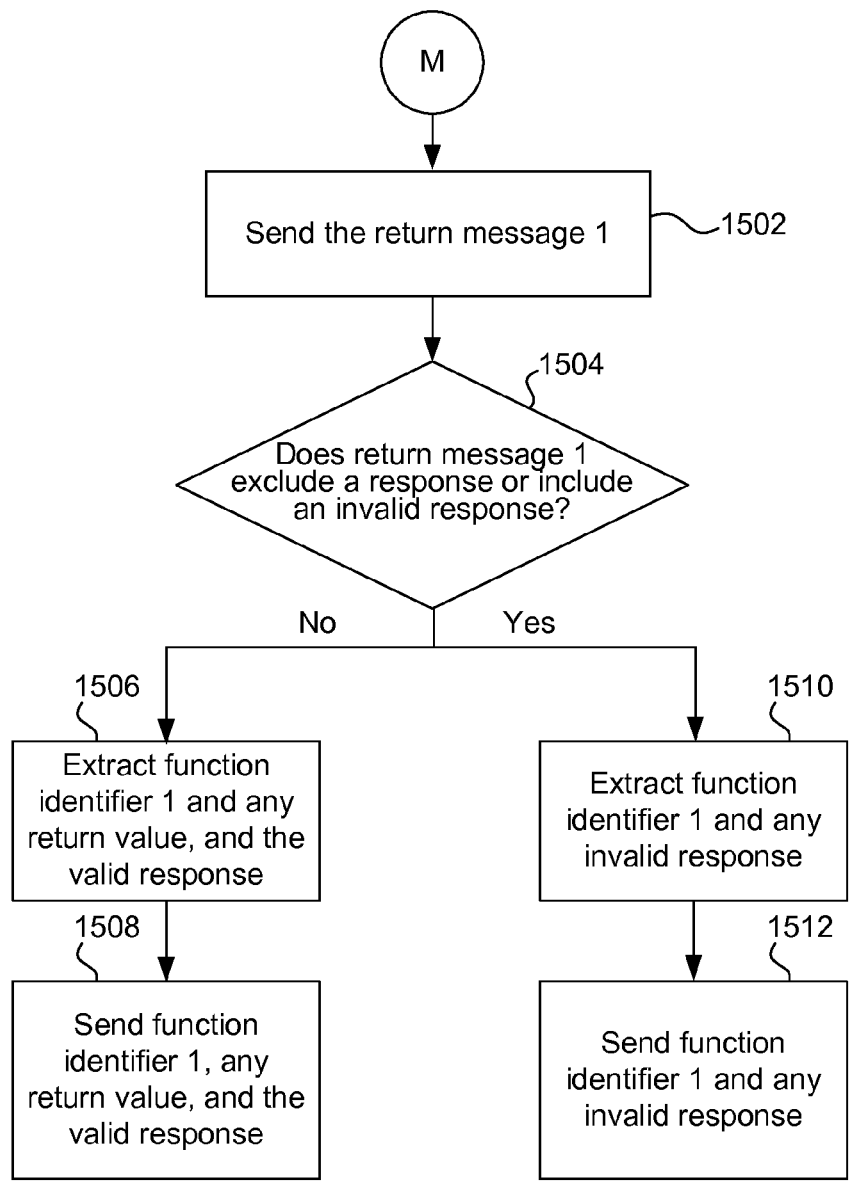
FIG. 15 is a continuation of the flowchart of FIG. 14.

FIGS. 13, 14, and 15 are a flowchart of an embodiment of a method for testing a component. Test module component 408 provides 1302 to test wrapper component 410 a function validity query to obtain a determination regarding validity of execution of instance 1 of function 1. Upon receiving 1304 the function validity query, test wrapper component 410 encapsulates 1306, in call message 1, the function validity query together with function identifier 1 and with any argument 1 that may be provided by test module component 408, and sends 1308 call message 1 via call connection 416 to functional wrapper component 412. Functional wrapper component 412 extracts 1310 function identifier 1, function validity query, and argument 1 if received encapsulated within call message 1, and provides 1402 the function identifier 1, function validity query, and argument 1 to functional module component 414.

Upon extracting function validity query, function identifier 1, and any argument 1 received from functional wrapper component 412, functional module component 414 executes instance 1 of function 1 identified by function event identifier 1 and also determines 1404 whether instance 1 of function 1 is validly executed. As an example, if function 1 is a read function for reading data from memory component 406, functional module component 414 determines whether data is read from memory component 406. Upon determining that data is read from memory component 406, functional module component 414 determines that instance 1 of function 1 is validly executed and upon determining that instance 1 of function 1 is validly executed, functional module component 414 creates a function validity read response, which is an exemplary validity indicator. On the other hand, upon determining that data is not read from memory component 406, functional module component 414 determines that instance 1 of function 1 is not validly executed and upon determining that instance 1 of function 1 is not validly executed, functional module component 414 does not create the function validity read response or creates a function invalidity read response, which is an exemplary validity indicator. As another example, if function 1 is a write function for writing argument 1 to memory component 406, functional module component 414 determines whether argument 1 is written to memory component 406. Such a determination can be made based on whether a response is received from memory component 406 upon sending a write command to the memory component 406. For example, after sending a write command to memory component 406, if functional module component 414 receives a response from memory component 406, functional module component 414 determines that argument 1 is written to memory component 406 and if functional module component 414 does not receive a response from memory component 406, functional module component 414 determines that argument 1 is not written to memory component 406. Upon determining that argument 1 is written to memory component 406, functional module component 414 determines that instance 1 of function 1 is validly executed and creates a function valid write response, which is an exemplary validity indicator. On the other hand, upon determining that argument 1 is not written to memory component 406, functional module component 414 determines that instance 1 of function 1 is not validly executed. Upon determining that instance 1 of function 1 is not validly executed, functional module component 414 does not create a function valid write response or creates a function invalid write response, which is an exemplary validity indicator.

Upon not creating the function valid read response or the function valid write response, functional module component 414 does not send 1406 a valid or invalid response to functional wrapper component 412. Moreover, alternatively, upon creating the function invalid read response or the function invalid write response, functional module component 414 sends 1406 the invalid response to functional wrapper component 412. On the other hand, upon creating the function valid read response or the function valid write response, functional module component 414 sends 1408 the valid response to functional wrapper component 412.

If functional wrapper component 412 receives the function invalid read response or the function invalid write response or does not receive a response, functional module wrapper module encapsulates 1410 function identifier 1 and the response in the return message 1 to create the return message 1, and sends 1502 the return message 1 to test wrapper component 410 via return connection 424.

On the other hand, if functional wrapper component 412 receives the function valid read response or the function valid write response from functional module component 414, functional wrapper component 412 encapsulates 1412 the response, the function identifier 1, and any return value that may be received from functional module component 414 to create the return message 1, and sends 1502 the return message 1 to test wrapper module via return connection 424.

Upon receiving the return message 1 from functional wrapper component 412, test wrapper component 410 determines 1504 whether return message 1 excludes any response or includes the function invalid read response or the function invalid write response. For example, upon receiving the return message 1 from functional wrapper component 412, test wrapper component 410 determines whether return message 1 includes the function valid read response or the function valid write response. Upon determining that return message 1 includes the function valid read response or the function valid write response, test wrapper component 410 extracts 1506 the response, function identifier 1 identifying function 1 that was performed, and any return value that may be received, and sends 1508 the function identifier, the return value, and the response to test module component 408. On the other hand, upon determining that return message 1 includes the function invalid read response or the function invalid write response or does not include any response, test wrapper component 410 extracts 1510 the invalid response, function identifier 1 identifying function 1 that was performed, and sends 1512 the function identifier and the invalid response to test module component 408.

Upon receiving the function valid read or write response, test module component 408 determines that instance 1 of function 1 is validly executed and that any return value received is valid. On the other hand, upon receiving the function invalid read or invalid write response or not receiving a response, test module component 408 determines that instance 1 of function 1 is not validly executed. An instance of a function may not be validly executed for any of a variety of reasons, such as, malfunction or inoperation of memory component 406, malfunction or inoperation of read connection 466, malfunction or inoperation of write connection 458, malfunction or inoperation of call connection 416, malfunction or inoperation of return connection 424, or malfunction or inoperation of event connection 432.

Any determination made by test module component 408 may be output via output device 212 (FIG. 2), such as a displayed on a display device or output as an audio signal by speakers or output in the form of various combinations of light colors of a light source.

Figure 16:
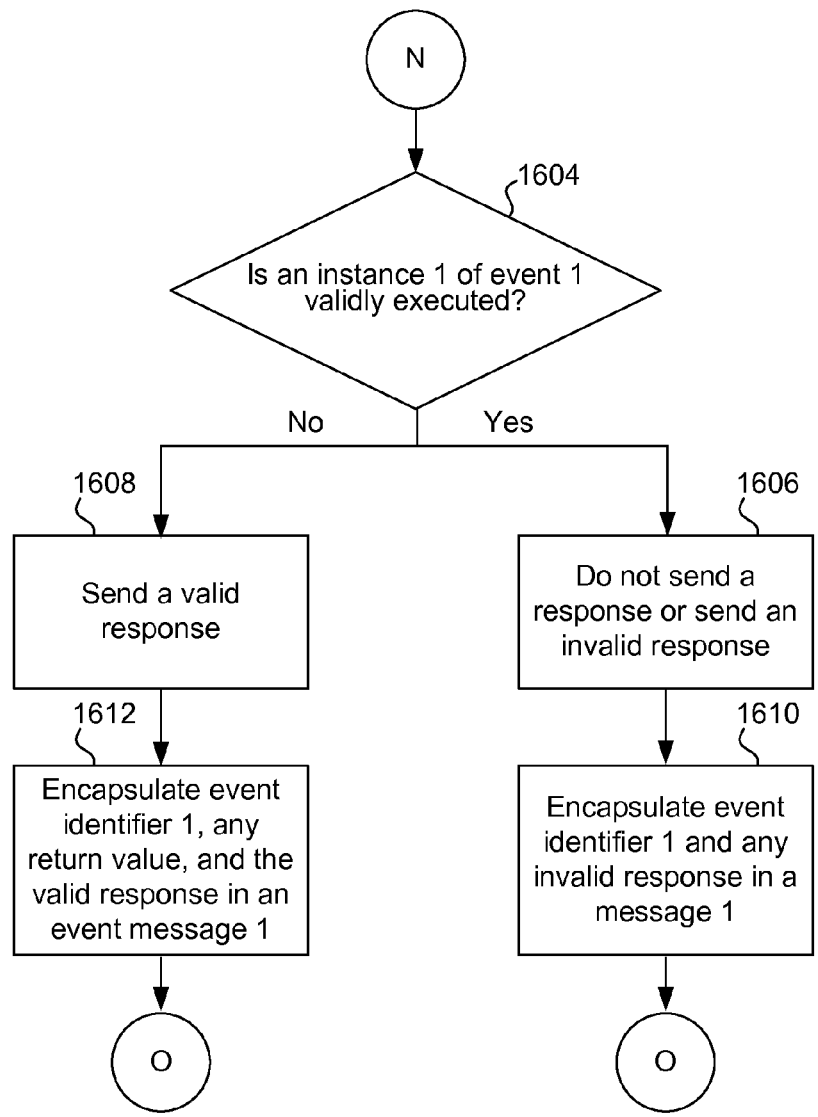
FIG. 16 is an embodiment of a method for testing a component by using encapsulation.
Figure 17:
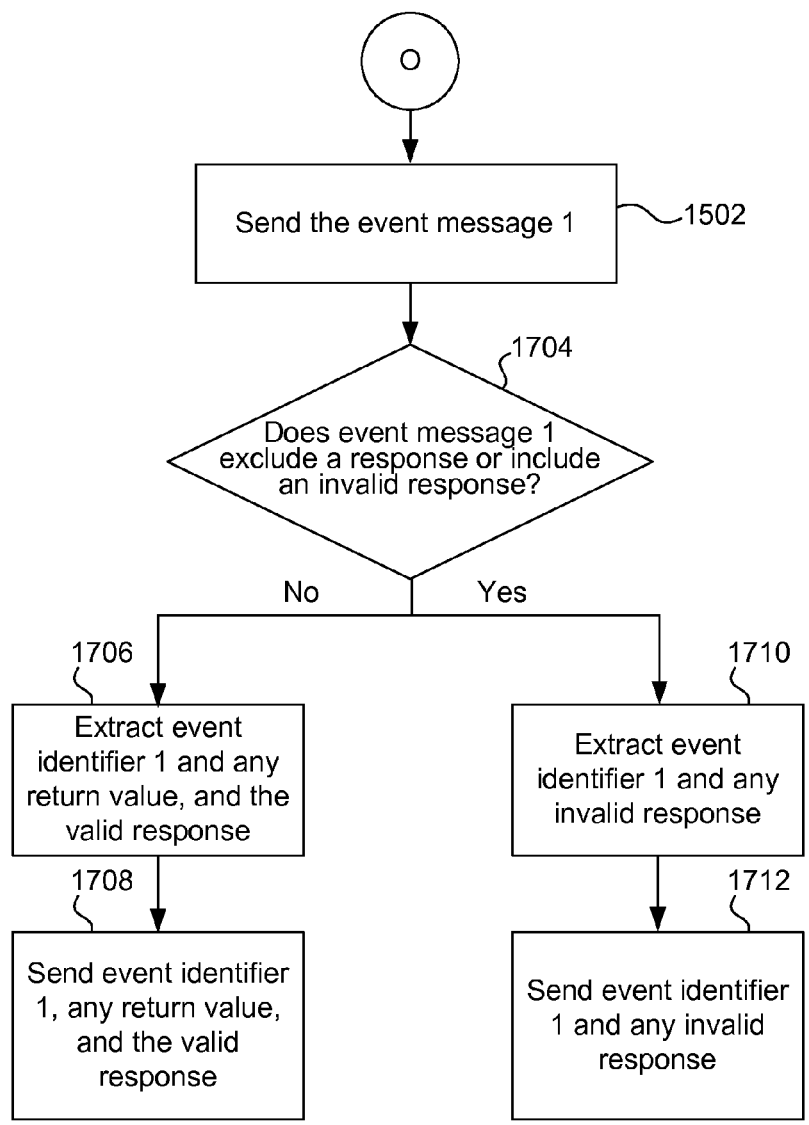
FIG. 17 is a continuation of the flowchart of FIG. 16.

FIGS. 16 and 17 is a flowchart of an embodiment of a method for testing a component. Functional module component 414 determines 1604 whether instance 1 of event 1 is validly executed in a similar manner in which functional module component 414 determines 1404 (FIG. 14) whether instance 1 of function 1 is validly executed. Functional module component 414 makes the determination 1604 to generate an event valid read response, an event valid write response, an event invalid read response, an event invalid write response, or not create a response in a similar manner as that described above with respect to a function. Each of event valid read response, event invalid read response, event valid write response, and event invalid read response are examples of a validity indicator.

Upon not creating the event valid read response or the event valid write response, functional module component 414 does not send 1606 a valid or invalid response to functional wrapper component 412. Moreover, alternatively, upon creating the event invalid read response or the event invalid write response, functional module component 414 sends 1606 the invalid response to functional wrapper component 412. On the other hand, upon creating the event valid read response or the event valid write response, functional module component 414 sends 1608 the valid response to functional wrapper component 412.

If functional wrapper component 412 receives the function invalid read response or the function invalid write response or does not receive a response, functional module wrapper module encapsulates 1610 function identifier 1 and the response in the event message 1 to create the event message 1, and sends 1702 the event message 1 to test wrapper component 410 via event connection 432.

On the other hand, if functional wrapper component 412 receives the event valid read response or the event valid write response from functional module component 414, functional wrapper component 412 encapsulates 1612 the response, the event identifier 1, and any event value that may be received from functional module component 414 to create the event message 1, and sends 1702 the event message 1 to test wrapper module via event connection 432.

Upon receiving the event message 1 from functional wrapper component 412, test wrapper component 410 determines 1704 whether event message 1 excludes any response or includes the event invalid read response or the event invalid write response. For example, upon receiving the event message 1 from functional wrapper component 412, test wrapper component 410 determines whether event message 1 includes the event valid read response or the event valid write response. Upon determining that event message 1 includes the event valid read response or the event valid write response, test wrapper component 410 extracts 1706 the response, event identifier 1 identifying event 1 that was performed, and any event value that may be received, and sends 1708 the event identifier, the event value, and the response to test module component 408. On the other hand, upon determining that event message 1 includes the event invalid read response or the event invalid write response or does not include any response, test wrapper component 410 extracts 1710 the invalid response, event identifier 1 identifying event 1 that was performed, and sends 1712 the event identifier and the invalid response to test module component 408.

Upon receiving the event valid read or write response, test module component 408 determines that instance 1 of event 1 is validly executed and that any event value received is valid. On the other hand, upon receiving the event invalid read or invalid write response or not receiving a response, test module component 408 determines that instance 1 of event 1 is not validly executed. An instance of an event may not be validly executed for any of the reasons described above.

Figure 18:
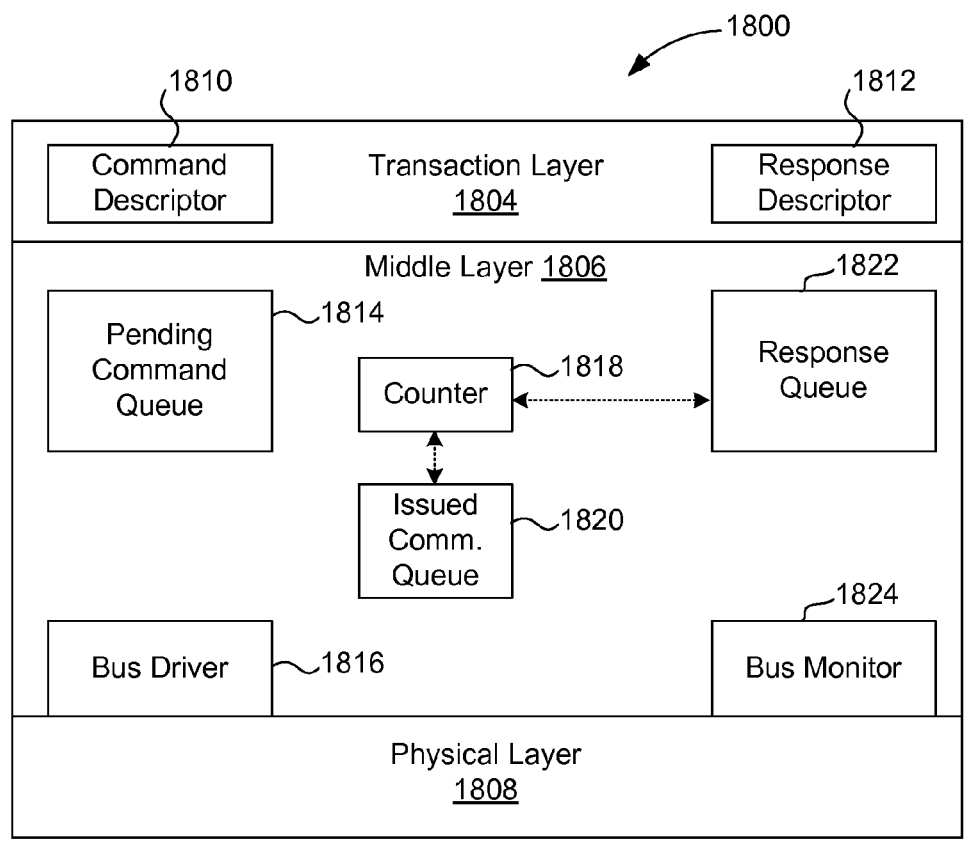
FIG. 18 is a block diagram of an embodiment of a functional module component that may be used within the system of FIG. 4.

FIG. 18 is a block diagram of an embodiment of a functional module component 1800. Functional module component 1802 is an example of functional module component 414 (FIG. 4). Functional module component 1802 includes a transaction layer 1804, a middle layer 1806, and a physical layer 1808. Transaction layer 1804 includes a command descriptor 1810 and a response descriptor 1812. Middle layer 1806 includes a pending command queue 1814, a bus driver 1816, a counter 1818, an issued command queue 1820, a response queue 1822, and a bus monitor 1824. Physical layer 1808 includes functional module component read pin 468 and functional module component write pin 460. It is noted that response queue 1822 may be created using SystemVerilog and cannot be created using VHDL. An example of each of response queue 1822, issued command queue 1820, and pending command queue 1814 includes a first-in-firstout (FIFO).

Functional module component 1802 creates command descriptor 1810 by populating the command descriptor 1810 with data, such as argument 1, and any other transaction information, such as whether a transaction is a read transaction or a write transaction, and pushes command descriptor 1810 onto pending command queue 1814. Bus driver 1816 pops command descriptor 1810 from pending command queue 1814 and issues a transaction request, such as a read request or a write request, onto read or write connection 458, to conduct a transaction, such as a read or write transaction, with respect to memory component 406 by using data in the command descriptor 1810. At the same time command descriptor 1810 is popped from pending command queue 1814, functional module component 1802 obtains a timestamp from counter 1818 and bundles the timestamp with command descriptor 1810 to create a bundled descriptor and pushes the bundled descriptor onto issued command queue 1820.

Bus monitor 1824 obtains bundled descriptor from issued command queue 1820 to determine a type of response, such as a response to a read request or a write request, to expect from read connection 466 or write connection 458. For example, in case of a write transaction, bus monitor 1824 may not expect any response from memory component 406 or expects an error write signal from memory component 406. An error write signal is generated in case of an incomplete write transaction in which all data within command descriptor 1810 is not written to memory device or a broken write transaction in which write connection 458 or memory component 406 is malfunctional or inoperational. As another example, in case of a read transaction, bus monitor 1824 expects to receive the return value or an error read signal from memory component 406. An error read signal is generated by memory component 406 in case of an incomplete read transaction in which all data from a particular memory location of memory component 406 is not read from the location or a broken read transaction in which data is not read from memory component 406 due to malfunction or inoperation of memory component 406 or malfunction or inoperation of read connection 466.

When a response is received by bus monitor 1824 from memory component 406 at end of a transaction, functional module component 1802 creates response descriptor 1812 including the response that may include the return value and the response descriptor 1812 is pushed onto response queue 1822. In addition, functional module component 1802 calculates a latency of a transaction by subtracting the timestamp from a current value of counter 1818 at a time of reception of a response by bus monitor 1824 from memory component 406.

Test module component 408 may query a state of response queue 1822, such as whether response queue 1822 is empty of full, by sending the query within a call message. If all command descriptors in pending command queue 1814 have corresponding response descriptors in response queue 1822, functional module component 1802 sends, in a return message, data such as '1', to indicate to test module component 408 that all command descriptors within issued command queue 1820 are executed. Otherwise, functional module component 1802 sends a '0'.

In various embodiments, functional module component 1802 fires an event indicating whether all commands in pending command queue 1814 are executed in the same manner as that described above except the event is not fired in response to a query from test module component 408 but rather upon an occurrence of the condition, such as whether response queue 1822 has response descriptors corresponding to all command descriptors in pending command queue 1814. Examples of an event include a notification that a fatal error has occurred in functional module component 1802, a notification that a response is received by functional module component 1802 from memory component 406 and pushed into response queue 1822, a notification that command descriptor 1810 is driven onto read connection 466 or write connection 458, a notification that all transactions corresponding to command descriptors within pending command queue 1814 are executed, a notification that pending command queue 1814 is occupied by command descriptors below a minimum threshold, a notification that pending command queue 1814 is occupied by command descriptors above the minimum threshold.

In an alternative embodiment, functional module component 1802 is generated using any HDL language, such as SystemVerilog, VHDL, or Verilog.

Although the systems and methods are described herein with respect to PLD 100 (FIG. 2), the systems and methods are also applicable to an ASIC.

If both test module component 408 and functional module component 414 use the same programming language, which is the programming language used to create the components, test module component 408 can directly access functions 1 and 2 of API 439 without the use of test wrapper component 410 and functional wrapper component 412.

In a case in which test module component 408 and functional module component 414 use different programming languages, without the use of test wrapper component 410 and functional module component 414, test module component 408 and functional module component 414 can be interconnected directly via a set of pins (not shown), and the programming language used to create test module component 408 restricts how functions 1 and/or 2 are accessed by test module component 408. However, in such an embodiment, a language used by test module component 408, which is the same language used to create test module component 408, restricts how an instance of a function of API 439 can be accessed. For example, a language used by test module component 408, in and of itself, does not support an API call. This restriction prevents test module component 408 from calling a function of functional module component 414. Hierarchical, cross module access of functions 1 and/or 2 are not supported in the programming language used to create test module component 408.

The systems and methods, described herein, make it possible to use functional module component 414 having procedural API 439 within the test bench. By packaging functions and/or events of API 439 as messages, which may be packets, the messages can be transferred to test module component 408 over corresponding event and/or function connections, which may include Avalon™-ST interfaces. Hence, test module component 408, which may use VHDL, and functional module component 414, which may use Verilog, can be interconnected via test wrapper component 410, functional wrapper component 412, and any or all of return connection 424, call connection 416, and event connection 432, and thus exchange information regarding API 439.

The systems and methods, described herein, allow an interoperation of functional module component 414 within a test bench. The systems and methods provide a mechanism for test module component 408, which may be a test program, to access API 439. Test module component 408 and the functional module component 414 can be implemented in distinct register transfer level (RTL) languages, such as VHDL and Verilog. Communication between test module component 408 and the functional module component 414 is via a call message, a return message, and/or an event message transported over corresponding call connection 416, return connection 424, and event connection 432.

A single implementation in two languages rather than two implementations, one in each language, offers a plurality of benefits including lower development and maintenance cost. Moreover, no issues are created with model mismatches between two distinct languages. Systems and methods, described herein, allow functional module component 414 that uses one language to run in a test bench environment that uses another language or any simulator that uses dual language simulation.

The systems and methods, described herein, maps an API call onto call connection 416 and an API return onto return connection 424 to facilitate communication between test module component 408 and functional module component 414. API call and return features are not available if test module component 408 and functional module component 414 are created, such as written, in the same language.

It is further noted that the systems and methods described herein do not apply to a Transaction Level Modeling™ (TLM™) 2.0 standard that is applied for interoperability between components created with SystemC and SystemVerilog protocols.

Although the foregoing systems and techniques have been described in detail by way of illustration and example for purposes of clarity and understanding, it will be recognized that the above described systems and techniques may be embodied in numerous other specific variations and embodiments without departing from the spirit or essential characteristics of the systems and techniques. Certain changes and modifications may be practiced, and it is understood that the systems and techniques are not to be limited by the foregoing details, but rather is to be defined by the scope of the appended claims.

What is claimed is:

1. A method for testing a device under test (DUT), said method comprising:
   sending, by a test module component, to a test wrapper component, a function identifier of a function to be performed by a functional module component; wherein:
   the test module component and the functional module component are coupled via a plurality of pins;
   the test module component is created by using a first programming language;
   the functional module component is created by using a second programming language different than the first programming language;
   the functional module component or the test module component is a hardware component of an integrated circuit that includes a programmable logic device or an application specific integrated circuit; and,
   with the test wrapper component:
      encapsulating, the function identifier within a call message; and
      sending the encapsulated function identifier as a call message, via at least two pins of the plurality of pins, wherein the functional module component or the test module component is a hardware component of an integrated circuit, to the functional module component; and,
   with the functional module component, testing the DUT by executing an instance of the function on the DUT.

2. The method of claim 1, wherein said sending the call message comprises sending the call message via a first pin of the plurality of pins including an output pin of the test module component and via a second pin of the plurality of pins including an input pin of the functional module component.

3. The method of claim 1, wherein the test module component and the functional module component are coupled via a call channel and a return channel.

4. The method of claim 1, wherein the functional module component and the test module component are integrated within the same integrated circuit.

5. The method of claim 1, wherein the functional module component and the test module component are integrated within separate integrated circuits.

6. The method of claim 1, wherein said encapsulating comprises encapsulating an argument within the call message.

7. The method of claim 1, further comprising:
   receiving the call message;
   extracting, at the functional module component, the function identifier from the encapsulated function identifier;
   encapsulating, within a return message, a second function identifier of the function;
   sending the return message via at least two pins of the plurality of pins; and
   receiving, at the test module component, the return message.

8. The method of claim 7, wherein said encapsulating the second function identifier comprises encapsulating, within the return message, a validity indicator or a return value generated by executing the function.

9. The method of claim 7, wherein said sending the return message comprises sending the return message via a third pin of the plurality of pins including an output pin of the functional module component and a fourth pin of the plurality of pins including an input pin of the test module component.

10. The method of claim 1, further comprising:
   creating a test bench including the test module component and the functional module component by using a system on a programmable chip builder; and
   associating each of the functional module component, the test module component, and other components of the test bench with a hardware file.

11. The method of claim 1, further comprising establishing communication between the test module component and the functional module component only via the call message, a return message, or an event message.

12. A system for testing a device under test (DUT), said system comprising:
   a test module component;
   a test wrapper component; and
   a functional module component coupled to the test module component via a plurality of pins, wherein:
   the test module component is created by using a first programming language;
   the functional module component is created by using a second programming language different than the first programming language;
   the test module component is configured to send, to the test wrapper component, a function identifier of a function to be executed by the functional module component on the DUT;
   the functional module component or the test module component is a hardware component of an integrated circuit;
   the integrated circuit includes a programmable logic device or an application specific integrated circuit; and
   the test wrapper component is configured to encapsulate, within a call message, the function identifier, and send the call message, via at least two pins of the plurality of pins, to the functional module component.

13. The system of claim 12, wherein the test wrapper component is configured to send the call message via a first pin of the plurality of pins including an output pin of the test module component and via a second pin of the plurality of pins of including an input pin of the functional module component.

14. A method for testing a device under test (DUT), said method comprising:
   receiving, by a functional module component, a call message, the call message comprising an encapsulated function identifier of a function to be executed by the functional module component on the DUT, wherein:
   a test module component and the functional module component are coupled via a plurality of pins;
   the test module component is created by using a first programming language;
   the functional module component is created by using a second programming language different than the first programming language;
   said receiving comprises receiving the call message from the test module component via at least two pins of the plurality of pins;
   the functional module component or the test module component is a hardware component of an integrated circuit; and
   the integrated circuit includes a programmable logic device or an application specific integrated circuit.

15. The method of claim 14, wherein said receiving comprises receiving the identifier call message via a first pin of the plurality of pins including an output pin of the test module component and via a second pin of the plurality of pins including an input pin of the functional module component.

16. A system for testing a device under test (DUT), said system comprising:

a test module component;
a functional module component coupled to the test module component via a plurality of pins; and
a functional wrapper component coupled to the functional module component; wherein:
the test module component is created by using a first programming language;
the functional module component is created by using a second programming language different than the first programming language;
the functional wrapper component is configured to receive a call message, the call message comprising an encapsulated function identifier of a function to be executed by the functional module component on the DUT,
the functional wrapper component is configured to receive the call message via at least two pins of the plurality of pins,
the functional module component or the test module component is a hardware component of an integrated circuit, and
the integrated circuit includes a programmable logic device or an application specific integrated circuit.

17. The system of claim 16, wherein the functional wrapper component is configured to receive the encapsulated function identifier via a first pin of the plurality of pins including an output pin the test module component and via a second pin of the plurality of pins of the functional wrapper component.

18. A method for sending an encapsulated event identifier, the method comprising:
generating an event message or a return message;
encapsulating, within the event message, an event identifier or within the return message, a function identifier; and
sending the encapsulated event identifier as the event message or the encapsulated function identifier as the return message via a plurality of pins coupling a test module component and a functional module component, wherein:
the test module component is created by using a first programming language;
the functional module component is created by using a second programming language different than the first programming language;
the functional module component or the test module component is a hardware component of an integrated circuit; and
the integrated circuit includes a programmable logic device or an application specific integrated circuit.

19. The method of claim 18 further comprising distinguishing an event identified by the event identifier from a function identified by the function identifier by naming the event with a prefix or a suffix and using the same prefix or suffix to name another event.

20. The method of claim 18, wherein said sending comprises sending the encapsulated event identifier via a first pin of the plurality of pins including an output pin of the functional module component and via a second pin of the plurality of pins including an input pin of the test module component.

21. The method of claim 18 further comprising encapsulating a validity indicator within the event message or the return message.

22. A testing system comprising:
a test module component;
a functional module component coupled via a plurality of pins to the test module component; and
a functional wrapper component coupled to the functional module component, wherein the functional wrapper component is configured to encapsulate, within an event message, an event identifier or encapsulate within a return message, a function identifier, wherein:
the functional wrapper component is configured to send the encapsulated event identifier as the event message or the encapsulated function identifier as the return message via the plurality of pins;
the test module component is created by using a first programming language;
the functional module component is created by using a second programming language different than the first programming language;
the functional module component or the test module component is a hardware component of an integrated circuit; and
the integrated circuit includes a programmable logic device or an application specific integrated circuit.

23. A method for receiving an encapsulated event identifier comprising:
receiving an encapsulated event identifier as an event message or an encapsulated function identifier as a return message via a plurality of pins coupling a test module component and a functional module component, wherein:
one or both of the test module component and the functional module component comprises an associated message wrapper component, the message wrapper component being configured to receive an encapsulated event identifier as an event message or an encapsulated function identifier as a return message via the plurality of pins,
the functional module component or the test module component is a hardware component of an integrated circuit; and
the integrated circuit includes a programmable logic device or an application specific integrated circuit.

* * * * *